(12) United States Patent
Matsubara et al.

(10) Patent No.: US 8,855,232 B2
(45) Date of Patent: Oct. 7, 2014

(54) TRANSMISSION APPARATUS AND TRANSMISSION METHOD

(71) Applicant: Fujitsu Limited, Kawasaki (JP)

(72) Inventors: Satoshi Matsubara, Kawasaki (JP); Hideharu Shako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 40 days.

(21) Appl. No.: 13/716,116

(22) Filed: Dec. 15, 2012

(65) Prior Publication Data

US 2013/0243125 A1 Sep. 19, 2013

(30) Foreign Application Priority Data

Mar. 19, 2012 (JP) ................. 2012-062893

(51) Int. Cl.
  H03F 1/32 (2006.01)
  H03F 3/189 (2006.01)
  H04B 1/62 (2006.01)
  H03F 3/24 (2006.01)
  H03G 3/30 (2006.01)

(52) U.S. Cl.
  CPC ............... H04B 1/62 (2013.01); H03F 1/3247 (2013.01); H03F 3/189 (2013.01); H03F 2200/336 (2013.01); H03F 3/245 (2013.01); H03G 3/3042 (2013.01); H03F 2201/3233 (2013.01)
  USPC ............. 375/297; 375/295; 375/296; 455/69; 455/114.3; 455/127.1; 455/522; 330/149

(58) Field of Classification Search
  CPC ....................................................... H04B 1/62
  USPC ................. 375/295, 296, 297; 455/69, 114.3, 455/127.1; 330/149
  See application file for complete search history.

(56) References Cited

U.S. PATENT DOCUMENTS

| 6,836,517 B2 | 12/2004 | Nagatani |
| 7,466,763 B2 | 12/2008 | Funyu et al. |
| 7,514,996 B2 | 4/2009 | Furuta et al. |
| 7,561,856 B2 | 7/2009 | Watabe et al. |
| 2007/0239152 A1 | 10/2007 | Trezon |
| 2010/0304694 A1 | 12/2010 | Suzuki et al. |
| 2012/0224654 A1* | 9/2012 | Nagatani et al. .............. 375/297 |

FOREIGN PATENT DOCUMENTS

| JP | 2001-189685 | 7/2001 |
| JP | 2004-007446 | 1/2004 |
| JP | 2005-217507 | 8/2005 |
| JP | 2007-049251 | 2/2007 |
| JP | 2008-295089 | 12/2008 |
| JP | 2010-278505 | 12/2010 |

* cited by examiner

Primary Examiner — Leon Flores
(74) Attorney, Agent, or Firm — Fujitsu Patent Center

(57) ABSTRACT

A transmission apparatus includes a signal processing unit to perform a distortion compensation process on a transmitting signal based on a distortion compensation coefficient, and an updating unit to update a transmission power of the transmitting signal subjected to the distortion compensation process in certain processes, to transmit the transmitting signal at the updated transmission power. The signal processing unit may set a referring range of the distortion compensation coefficient stored in a storage unit, based on the transmitting signal before performing the distortion compensation process and the transmitting signal having the transmission power thereof updated by the updating unit.

13 Claims, 14 Drawing Sheets

TRANSMISSION APPARATUS AND TRANSMISSION METHOD

CROSS-REFERENCE TO RELATED APPLICATIONS

This application is based upon and claims the benefit of priority of the prior Japanese Patent Application No. 2012-062893, filed on Mar. 19, 2012, the entire contents of which are incorporated herein by reference.

FIELD

The embodiments discussed herein are related to a transmission apparatus and a transmission method.

BACKGROUND

Recently, many wireless communication systems employ a technique that performs a digital processing in order to realize a highly efficient transmission. In the wireless communication system that employs a multi-value phase modulation technique, it may be important for a transmission end to linearize an amplifying characteristic of a power amplifier in order to suppress a non-linear distortion, and to reduce an adjacent channel leakage.

In addition, the non-linear distortion occurs when the linearity of the power amplifier is relatively poor. For this reason, it may be required to compensate for the non-linear distortion in a case in which the power efficiency is to be improved while using the power amplifier having a relatively poor linearity.

FIG. 1 is a block diagram illustrating an example of a transmission apparatus. In the transmission apparatus illustrated in FIG. 1, a transmitting signal generating unit 1 generates a digital data sequence, and inputs the serial digital data sequence to a S/P (Serial-to-Parallel) converter 2. The S/P converter 2 converts the digital data sequence into signals of two systems, namely, a phase component signal and a quadrature component signal, by alternatively allocating the digital data sequence in units of 1 bit. The phase component signal may be referred to as an I signal (In-Phase component), and the quadrature component may be referred to as a Q signal (Quadrature component). The I signal and the Q signal are input to a D/A (Digital-to-Analog) converter 3. The D/A converter 3 converts the I signal and the Q signal into a baseband signal, and inputs the baseband signal to a quadrature modulator 4.

The quadrature modulator 4 multiplies a reference carrier wave and a phase-shifted carrier wave obtained by phase-shifting the reference carrier wave by 90° to the I signal and the Q signal that are converted into the analog baseband signal, respectively. In addition, the quadrature modulator 4 carries out a quadrature transformation by adding the signal that is obtained by multiplying the reference carrier wave to the analog baseband signal, and the signal that is obtained by multiplying the phase-shifted carrier wave to the analog baseband signal. An output quadrature modulated signal of the quadrature modulator 4 is input to a frequency converter 5.

The frequency converter mixes the quadrature modulated signal and a local oscillation signal in order to convert the quadrature modulated signal into a radio frequency signal that is input to a power amplifier 6. The power amplifier 6 amplifies the radio frequency signal, and the radio frequency signal is transmitted to air via an antenna 7.

In a mobile communication system such as a W-CDMA (Wideband Code Division Multiple Access), the transmission power may be 10 mW to several tens of W and relatively high.

FIG. 2 is a diagram illustrating an example of an input and output characteristic of the power amplifier 6. In FIG. 2, the abscissa indicates the power (dB) of the input signal (or input power) of the power amplifier 6, and the ordinate indicates the power (dB) of the output signal (or output power) of the power amplifier 6.

FIG. 2 illustrates an example in which the input and output characteristic of the power amplifier 6 includes a distortion function f(p). As indicated by a dotted line in FIG. 2, the input power and the output power are in a non-linear relationship. The non-linear distortion occurs when the relationship of the input power and the output power is non-linear.

FIG. 3 is a diagram illustrating an example of a frequency spectrum in a vicinity of a transmission frequency fo. In FIG. 3, the abscissa indicates the frequency. In FIG. 3, a characteristic "a" before the non-linear distortion occurs is indicated by a dotted line, and a characteristic "b" after the non-linear distortion occurs is indicated by a solid line. In other words, the characteristic "a" represents an ideal characteristic for a case in which no non-linear distortion occurs.

Side lobes of the characteristic "b" are raised compared to those of the characteristic "a". When the side lobes are generated, an adjacent channel leakage of the transmission wave may occur. The adjacent channel leakage of the transmission wave may cause an adjacent channel interference. In other words, as the non-linear distortion illustrated in FIG. 3 becomes larger, the power of the adjacent channel leakage of the transmission wave may become higher as illustrated in FIG. 3.

The power of the adjacent channel leakage of the transmission wave (or leakage power) may be represented by an ACPR (Adjacent Channel Power Ratio). The ACPR may represent a ratio of the power of a target channel to the power of the adjacent channel leakage. The power of the target channel may be represented by an area of a spectrum between A and A' in FIG. 3. The power of the adjacent channel leakage may be represented by an area of a spectrum between B and B' in FIG. 3. The leakage power may act as noise with respect to other channels, and may deteriorate the communication quality of the other channels. Hence, strict restrictions may be prescribed with respect to the leakage power.

The leakage power becomes low in a linear region I of the power amplifier illustrated 6 in FIG. 2, and becomes high in a non-linear region II of the power amplifier 6 illustrated in FIG. 2.

As the input power becomes higher, the input and output characteristic of the power amplifier 6 makes a transition from the linear region I to the non-linear region II, and thus, the linear region I may need to be widened in order to obtain a high output from the power amplifier 6. However, in order to widen the linear region I, the power amplifier 6 may require a performance that is higher than actually required. For this reason, the cost and size of the transmission apparatus may inevitably increase.

For example, Japanese Laid-Open Patent Publications No. 2001-189685 and No. 2007-49251 propose wireless apparatuses provided with a function of compensating for a distortion in the transmission power.

In the transmission apparatus utilizing an adaptive control of DPD (Digital Pre-Distortion) as the digital non-linear distortion compensation technique, the carrier wave obtained by the quadrature modulation using the modulated signal is fed back and detected. In the transmission apparatus, the amplitude of the modulated signal (or transmitting baseband signal) and the amplitude of the fed back signal (or feedback baseband signal) are digitally converted and compared, and a distortion compensation coefficient is updated in real-time based on a result of the comparison. In this type of transmission apparatus, a LUT (Look-Up Table) is used to store the distortion compensation coefficient.

In the power amplifier, the relationship between the input power and the output power becomes non-linear in a saturation region. In other words, the distortion is more easily generated when the input power is high. Accordingly, in a case in which an average power of the signal is rapidly increased, the input power rapidly increases and the adaptive control of the DPD may not be performed in a sufficiently short time to thereby generate spurious noise. The spurious noise may sometimes be referred to as spurious emission.

FIG. 4 is a diagram illustrating an example of a referring range of the LUT for a case in which the adaptive control of the DPD is performed. In FIG. 4, the abscissa indicates an address for specifying the distortion compensation coefficient. The address may be represented in dB, and the power may become higher as the address value becomes larger. FIG. 4 illustrates an example of the address range having address values of "0" to "100". Of course, the address range may be less than "100", or "101" or more.

The upper half of FIG. 4 illustrates an example of the referring range of the LUT for a case in which the input power is low. The referring range of the distortion compensation coefficient in the LUT is updated depending on the input power. More particularly, the referring range of the distortion compensation coefficient in the LUT increases or decreases depending on the increase or decrease in the input power. When the input power is low, the range of the distortion compensation coefficient in the LUT, that is updated depending on the input power, may follow the increase or decrease in the input power, and the adaptive control of the DPD may be performed. The upper half of FIG. 4 illustrates an example in which the range of the input power and the referring range of the distortion compensation coefficient in the updated LUT are approximately the same.

The lower half of FIG. 4 illustrates an example of the referring range of the LUT for a case in which the input power is high. The referring range of the distortion compensation coefficient in the LUT is updated depending on the input power. However, when the input power is high, the referring range of the distortion compensation coefficient in the LUT is unable to follow the increase or decrease in the input power, and a range may be generated in which the adaptive control of the DPD is impossible, because the distortion of the output power becomes large with respect to the input power. When the distortion compensation coefficient in the range that cannot be referred to when performing the adaptive control of the DPD is specified, the power may rapidly increase and become high to generate the spurious noise. The spurious noise may also be referred to as interference wave. The lower half of FIG. 4 illustrates an example in which the referring range of the distortion compensation coefficient in the LUT is narrower than the range of the input power.

The so-called ramp-up control is one method of reducing the generation of the spurious noise. In the ramp-up control, the output power is gradually increased from a low output power to a desired output power. The interference wave is generated in steps because the output power is gradually increased, however, the adaptive control of the DPD may be performed within a sufficiently short time. By gradually increasing the output power, the spurious noise that is generated when the output power is varied to the desired output power may be reduced.

FIG. 5 is a diagram illustrating an example of the referring range of the LUT for a case in which the ramp-up control is performed. In FIG. 5, the abscissa indicates the address for specifying the distortion compensation coefficient. FIG. 5 illustrates a relationship between the range of the input power for the case in which the input power is gradually increased, and the referring range of the distortion compensation coefficient in the LUT. FIG. 5 illustrates an example of the address range having address values of "0" to "100". Of course, the address range may be less than "100", or "101" or more.

In the case in which the ramp-up control is performed, the distortion compensation coefficient in the range that cannot be referred to when performing the adaptive control of the DPD may be specified. When the distortion compensation coefficient in the range that cannot be referred to when performing the adaptive control of the DPD is specified, the power may rapidly increase to generate the spurious noise. Particularly when referring to the saturation range of the power amplifier 6, a difference between the initial LUT before the adaptive control and the LUT after the adaptive control may be large, which in turn may increase the spurious noise. For this reason, it may be desirable to reduce the generation of the spurious noise that cannot be prevented solely by the ramp-up control.

SUMMARY

Accordingly, it is an object in one aspect of the embodiment to provide a transmission apparatus and a transmission method, which may reduce the generation of spurious noise.

According to one aspect of the present invention, a transmission apparatus may include a storage unit configured to store a transmission power, and a distortion compensation coefficient to compensate for a distortion that is generated when making a transmission at the transmission power, in correspondence with each other, a signal processing unit configured to perform a distortion compensation process on a transmitting signal, based on the distortion compensation coefficient stored in the storage unit, an updating unit configured to update a transmission power of the transmitting signal that is subjected to the distortion compensation process in certain processes, and a transmitting unit configured to transmit the transmitting signal at the transmission power updated by the updating unit, wherein the signal processing unit sets a referring range of the distortion compensation coefficient stored in the storage unit, based on the transmitting signal before performing the distortion compensation process and the transmitting signal having the transmission power thereof updated by the updating unit, and updates the referring range depending on a transmission power that is set by the updating unit a next time and times thereafter when the distortion compensation process is performed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
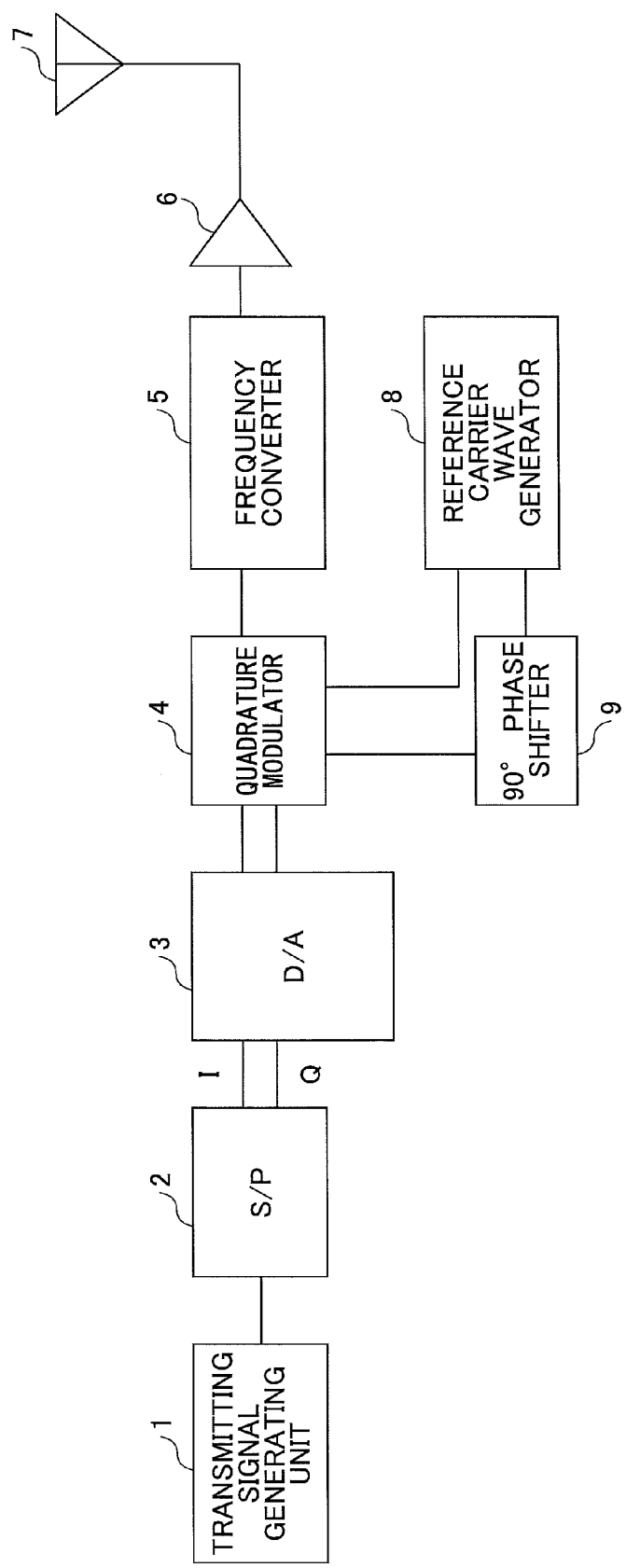
FIG. 1 is a block diagram illustrating an example of a transmission apparatus.
Figure 2:
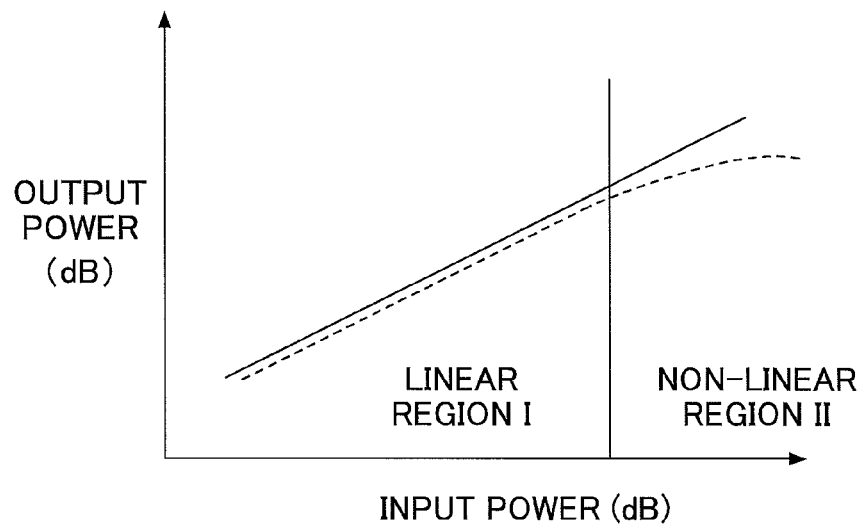
FIG. 2 is a diagram illustrating an example of an input and output characteristic of a power amplifier.
Figure 3:
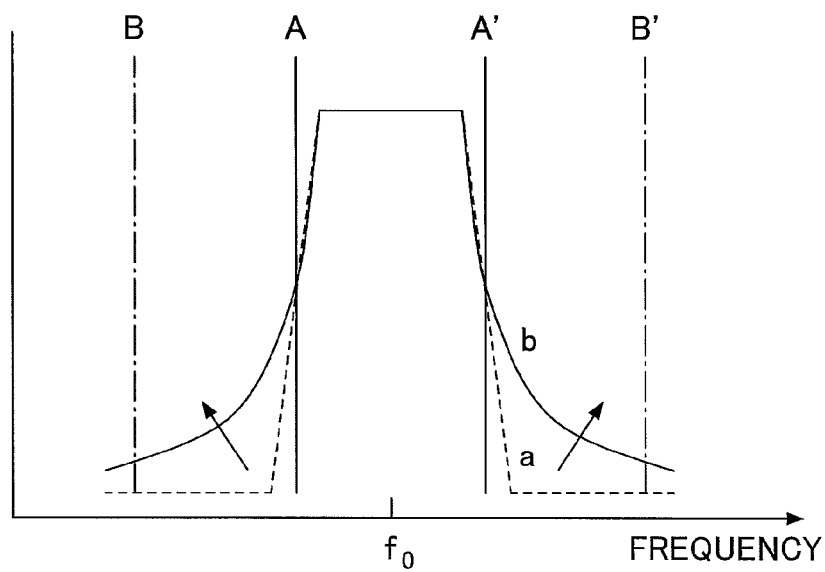
FIG. 3 is a diagram illustrating an example of a frequency spectrum in a vicinity of a transmission frequency.
Figure 4:
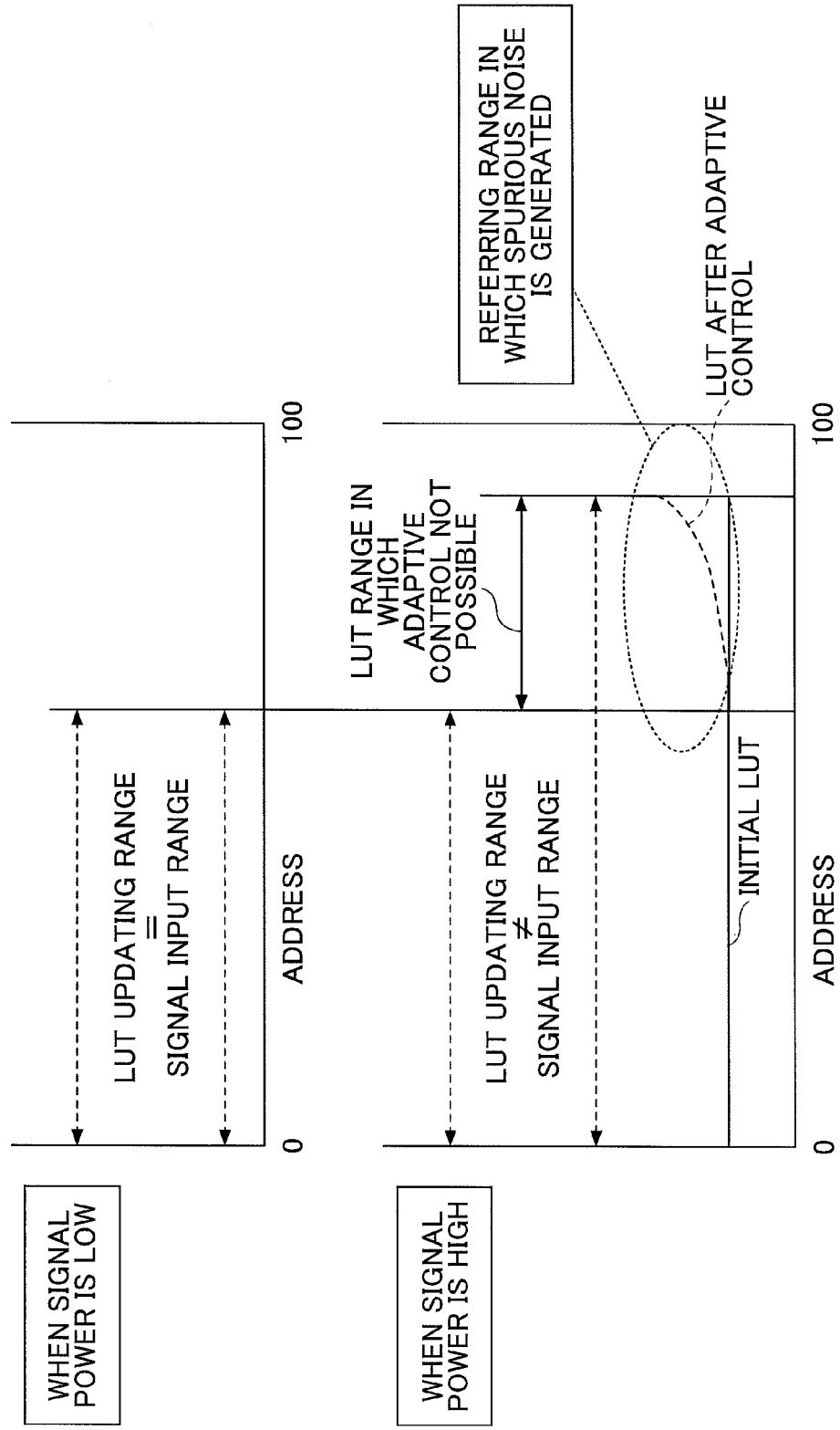
FIG. 4 is a diagram illustrating an example of a referring range of a LUT for a case in which an adaptive control of the DPD is performed.
Figure 5:
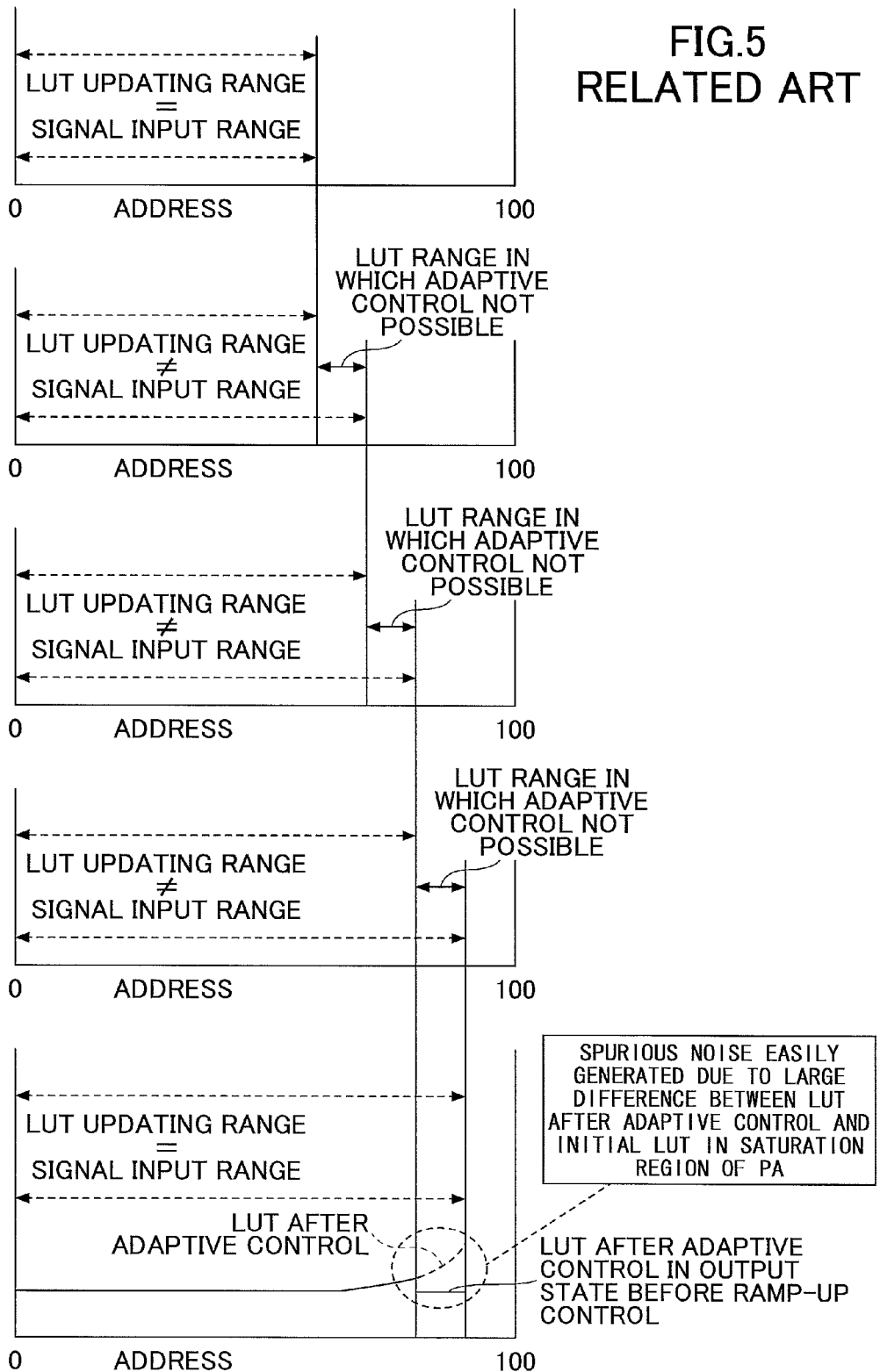
FIG. 5 is a diagram illustrating an example of the referring range of the LUT for a case in which a ramp-up control is performed.

Preferred embodiments of the present invention will be described with reference to the accompanying drawings.

A description will now be given of the transmission apparatus and the transmission method in each embodiment according to the present invention.

In the following description, those parts having the same functions are designated by the same reference numerals, and a description thereof will be omitted.

<Base Station 100>

Figure 6:
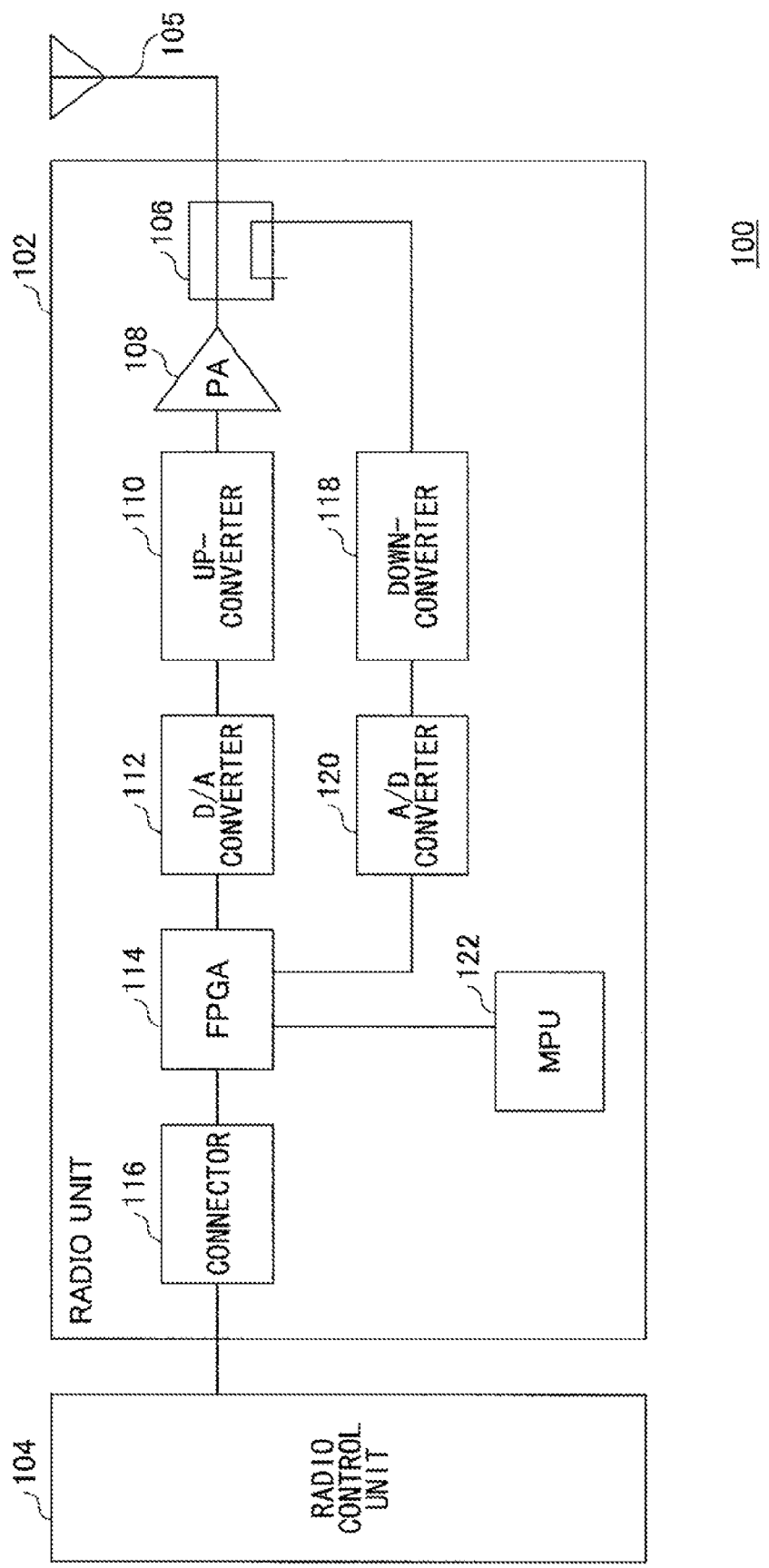
FIG. 6 is a block diagram illustrating a base station in one embodiment.

FIG. 6 is a block diagram illustrating a base station in one embodiment. FIG. 6 illustrates mainly a part of a base station 100 related to a transmission process. The base station 100 may include a radio unit (or RE: Radio Equipment) 102 and a radio control unit (or REC: Radio Equipment Control) 104.

The radio unit 102 and the radio control unit 104 may be connected via an optical fiber or the like, for example. By connecting the radio unit 102 and the radio control unit 104 via the optical fiber or the like, the radio unit 102 may be separated from the radio control unit 104. In addition, the radio unit 102 may be arranged in a vicinity of an antenna 105, and thus, a cable loss may be reduced and a power consumption of the base station 100 may be reduced.

The radio unit 102 may include the antenna 105, a directional coupler 106, a PA (Power Amplifier) 108, an up-converter 110, a D/A (Digital-to-Analog) converter 112, a FPGA (Field Programmable Gate Array) 114, a connector 116, a down-converter 118, an A/D (Analog-to-Digital) converter 120, and a MPU (Micro-Processing Unit) 122. At least a part of the radio unit 102, including the antenna 105, may function as an example of a transmitting unit to transmit the transmitting signal with a transmission power that may be updated.

A data signal from the radio control unit 104 may be input to the FPGA 114 via the connector 116. The connector 116 may be formed by a so-called CPRI (Common Public Radio Interface), for example. The FPGA 114 may be connected to the connector 116. The FPGA 114 may carry out a signal processing, which may include a distortion compensation process, with respect to the data signal from the connector 116. The FPGA 114 may input the data signal, subjected to the signal processing, to the D/A converter 112. The D/A converter 112 may be connected to the FPGA 114. The D/A converter 112 may convert the data signal, subjected to the signal processing in the FPGA 114, into an analog data signal. The D/A converter 112 may input the analog data signal to the up-converter 110. The up-converter 110 may be connected to the D/A converter 112. The up-converter 110 may subject the analog data signal from the D/A converter 112 to an up-conversion. An up-converted analog data signal output from the up-converter 110 may be input to the PA 108. The PA 108 may be connected to the up-converter 110. The PA 108 may amplify the up-converted analog data signal into an amplified data signal. The PA 108 may transmit the amplified data signal via the antenna 105.

The directional coupler 106 may be connected to the PA 108 and the antenna 105. The directional coupler 106 may input the amplified data signal from the PA 108 to the down-converter 118. The down-converter 118 may be coupled to the directional coupler 106. The down-converter 118 may subject the signal from the directional coupler 106 to a down-conversion. A down-converted signal output from the down-converter 118 may be input to the A/D converter 120.

The A/D converter 120 may be connected to the down-converter 118. The A/D converter 120 may convert the signal from the down-converter 118 into a digital signal. The A/D converter 120 may input the digital signal to the FPGA 114. The FPGA 114 may be connected to the A/D converter 120. The FPGA 114 may function as an example of a signal processing unit to carry out the distortion compensation process using the digital signal from the A/D converter 120. The MPU 122 may be connected to the FPGA 114. The MPU 122 may control the FPGA 114. The FPGA 114 may form a CPU (Central Processing Unit, not illustrated), and the FPGA 114 may operate under a control of the CPU.

<Transmission Apparatus 200>

Figure 7:
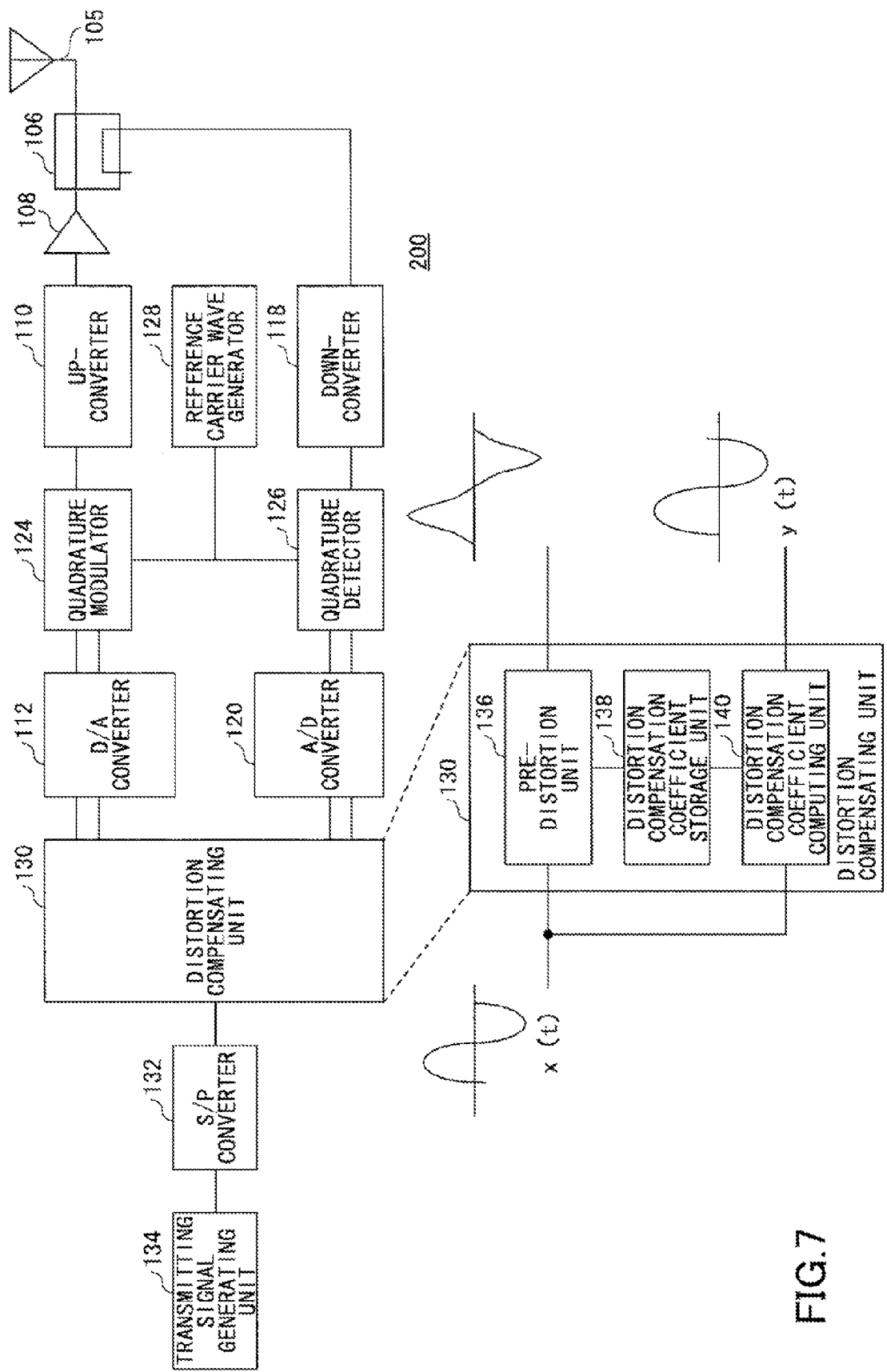
FIG. 7 is a block diagram illustrating a functional structure of a transmission apparatus in one embodiment.

FIG. 7 is a block diagram illustrating a functional structure of a transmission apparatus in one embodiment. A transmission apparatus 200 illustrated in FIG. 7 may be included in the base station 100. The transmission apparatus 200 may carry out the distortion compensation according to the digital non-linear distortion compensation technique, such as the DPD (Digital Pre-Distortion).

The transmission apparatus 200 illustrated in FIG. 7 may include an antenna 105, a directional coupler 106, a PA 108, an up-converter 110, a quadrature modulator 124, a D/A converter 112, a down-converter 118, a quadrature detector 126, an A/D converter 120, a reference carrier wave generator 128, a distortion compensating unit 130, a S/P (Serial-to-Parallel) converter 132, and a transmitting signal generating unit 134.

The transmitting signal generating unit 134 may generate a digital data group as the transmitting signal. The transmitting signal generating unit 134 may input the digital data group to the S/P converter 132. The S/P converter 132 may be connected to the transmitting signal generating unit 134. The S/P converter 132 may convert the digital data group from the transmitting signal generating unit 134 into signals of two systems, namely, an I signal and a Q signal, and input the I and Q signals to the distortion compensating unit 130. The distortion compensating unit 130 may be connected to the S/P converter 132. For example, the distortion compensating unit 130 may be formed by a DSP (Digital Signal Processor) that is an example of a signal processing unit to perform the distortion compensation process.

The distortion compensating unit 130 may subject the signal from the S/P converter 132 to a pre-distortion process. The distortion compensating unit 130 may input the I signal and the Q signal, subjected to the pre-distortion process, to the D/A converter 112. The D/A converter 112 may convert the I signal and the Q signal from the distortion compensating unit 130 into an analog baseband signal. The D/A converter 112 may input the analog baseband signal to the quadrature modulator 124.

The quadrature modulator 124 may be connected to the D/A converter 112. The quadrature modulator 124 may multiply a reference carrier wave to a phase-shifted carrier wave that is obtained by phase-shifting the reference carrier wave by 90°, that are input from the reference carrier wave generator 128, to the I signal and the Q signal from the D/A converter 112, respectively. The quadrature modulator 124 may carry out a quadrature modulation by adding the signal that is obtained by multiplying the reference carrier wave to the I signal, and the signal that is obtained by multiplying the phase-shifted carrier wave to the Q signal. An output quadrature modulated signal of the quadrature modulator 124 may be input to the up-converter 110.

The reference carrier wave generator 128 may be connected to the quadrature modulator 124. The reference carrier wave generator 128 may input the reference carrier wave, and the phase-shifted carrier wave that is obtained by phase-shifting the reference carrier wave by 90°, to the quadrature modulator 124. The up-converter 110 may be connected to the quadrature modulator 124. The up-converter 110 may mix a local oscillation signal and the quadrature modulated signal from the quadrature modulator 124, in order to perform a frequency conversion. The up-converter 110 may input a frequency-converted signal to the PA 108.

The PA 108 may be connected to the up-converter 110. The PA 108 may amplify the power of the frequency-converted signal input from the up-converter 110. The PA 108 may radiate the frequency-converted signal that is subjected to the power amplification to the air via the antenna 105.

The directional coupler 106 may be connected to the PA 108 and the antenna 105. The directional coupler 106 may input the amplified signal from the PA 108 to the down-converter 118. The down converter 118 may be connected to the directional coupler 106. The down-converter 118 may subject the signal from the directional coupler 106 to a down-conversion, in order to perform a frequency conversion. The down-converter 118 may input the signal subjected to the down-conversion to the quadrature detector 126. The quadrature detector 126 may be connected to the down-converter 118. The quadrature detector 126 may multiply the reference carrier wave to the phase-shifted carrier wave that is obtained by phase-shifting the reference carrier wave by 90° to the signal from the down-converter 118, in order to perform a quadrature detection. The quadrature detector 126 may reproduce the I signal and the Q signal of the baseband signal at the transmitting end, by performing the quadrature detection. The quadrature detector 126 may input the reproduced I signal and the reproduced Q signal to the A/C converter 120.

The reference carrier wave generator 128 maybe connected to the quadrature detector 126. The reference carrier wave generator 128 may input the reference carrier wave and the phase-shifted carrier wave that is obtained by phase-shifting the reference carrier wave by 90°. The A/D converter 120 may be connected to the quadrature modulator 126. The A/D converter 120 my convert the I signal and the Q signal from the quadrature detector 126 into digital signals. The A/D converter 120 may input the digitally-converted I signal and Q signal to the distortion compensating unit 130.

The distortion compensating unit 130 may be connected to the A/D converter 120. The distortion compensating unit 130 may carry out an adaptive signal processing using a certain algorithm, in order to compare the transmitting signal before the distortion compensation and a feedback signal demodulated by the quadrature detector 126. The certain algorithm may include a LMS (Least Mean Square) algorithm. Of course, algorithms other than the LMS algorithm may be used as the certain algorithm.

The distortion compensating unit 130 computes a distortion compensation coefficient h(p1) in order to make the difference between the transmitting signal before the distortion compensation and the feedback signal zero. The distortion compensating unit 130 may function as an example of an updating unit to update the distortion compensation coefficient h(p1). By updating the distortion compensation coefficient h(p1), the non-linear distortion generated in the PA 108 may be reduced, and the non-linear distortion of the output power may be reduced. In addition, the adjacent channel leakage power may be reduced because the non-linear distortion may be reduced.

In addition, the distortion compensating unit 130 may update the referring range of the distortion compensation coefficient 130. By updating the referring range of the distortion compensation coefficient, the distortion compensation may be carried out using the distortion compensation coefficient h(p1), even when the input power rapidly increase.

<Distortion Compensation Unit 130>

The distortion compensating unit 130 may include a pre-distortion unit 136, a distortion compensation coefficient storage unit 138, and a distortion compensation coefficient computing unit 140. The functions of the pre-distortion unit 136 and the functions of the distortion compensation coefficient computing unit 140 may mainly be executed by the FPGA 114 under the control of the MPU 122. For example, when the MPU 122 functions according to a program executed thereby, the MPU 122 may cause the FPGA 114 to execute the functions of the pre-distortion unit 136 and the distortion compensation coefficient computing unit 140.

The pre-distortion unit 136 may subject a transmitting signal x(t) to a distortion compensation process (or pre-distortion), using the distortion compensation coefficient h(p1) according to a power level of the transmitting signal x(t). The distortion compensation coefficient storage unit 138 may store a power pi (i=1, . . . , 1023) of the transmitting signal x(t), and the distortion compensation coefficient h(pi) according to the power pi (i=0, . . . , 1023) of the transmitting signal x(t), in correspondence with each other.

The distortion compensation coefficient storage unit 138 may be formed by any suitable memory or recording medium which may be provided within the distortion compensating unit 130 or may be externally connected to the distortion compensating unit 130.

The distortion compensation coefficient computing unit 140 may compare the transmitting signal x(t) and a demodulated signal (or feedback signal) y(t) that is demodulated in the quadrature detector 126. More particularly, the distortion compensation coefficient computing unit 140 may compare the transmitting signal x(t) before the distortion compensation by the adaptive signal processing using the LMS algorithm, and the demodulated signal (or feedback signal) y(t) that is demodulated in the quadrature detector 126. The distortion compensation coefficient computing unit 140 computes the distortion compensation coefficient h(pi) that makes the difference between the transmitting signal x(t) and the feedback signal y(t) zero, and updates the distortion compensation coefficient stored in the distortion compensation coefficient storage unit 140.

Figure 8:
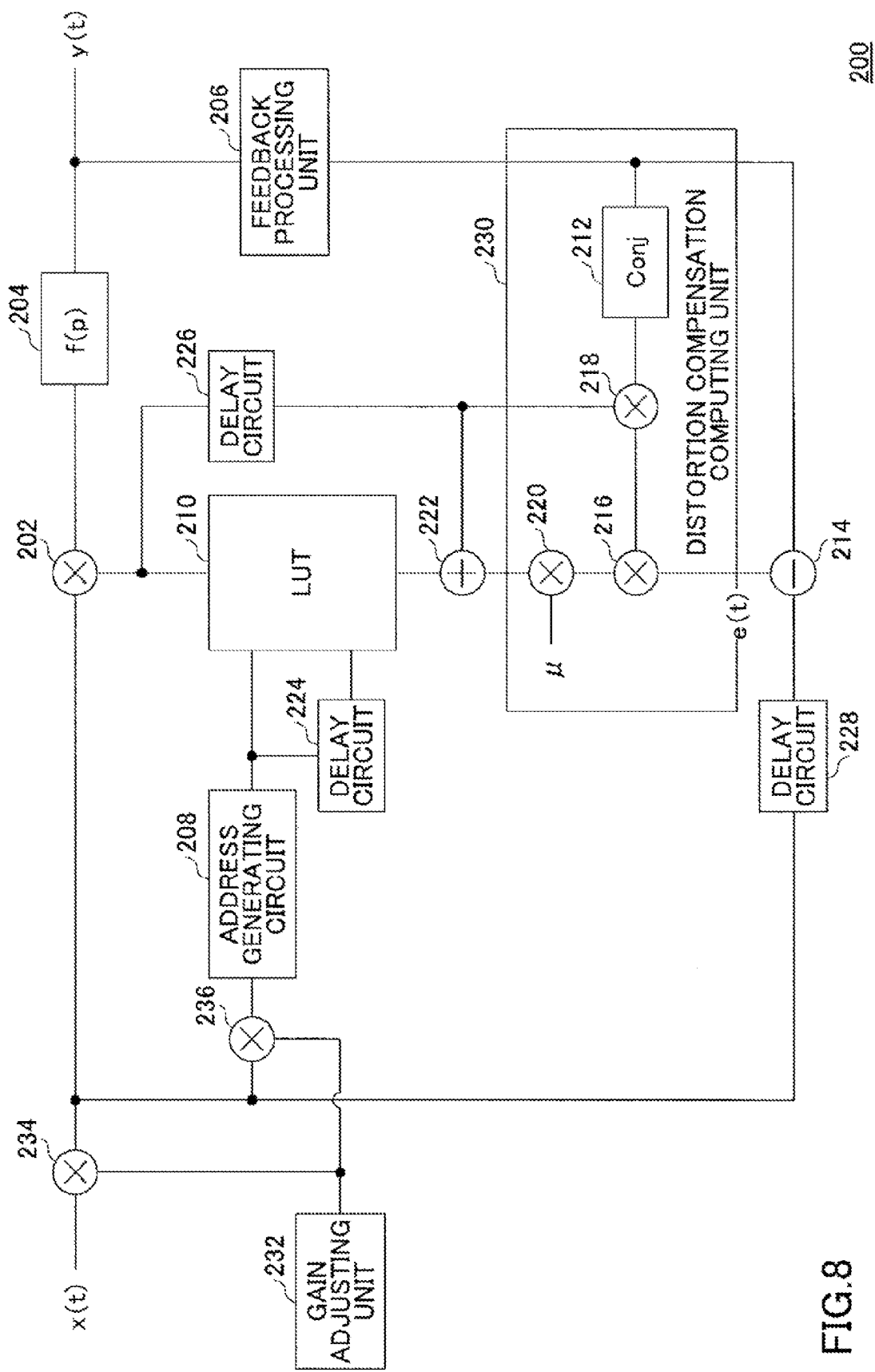
FIG. 8 is a diagram illustrating the transmission apparatus in one embodiment, including details of a distortion compensating unit.

FIG. 8 is a diagram illustrating the transmission apparatus in one embodiment, including details of the distortion compensating unit. FIG. 8 illustrates the details of the distortion compensating unit 130 of the transmission apparatus 200.

The transmission apparatus 200 illustrated in FIG. 8 may include multipliers 202, 234 and 236, an adder 222, a subtractor 214, delay circuits 224, 226 and 228, an address generating circuit 208, a gain adjusting unit 232, a LUT (Look-Up Table) 210, a feedback processing unit 206, a distortion compensation computing unit 230, and a distortion device 204. A distortion generated by the distortion device 204 may be represented by a distortion function f(p). The elements other than the distortion device 204 and the feedback processing unit 206 may be formed by the FPGA 114 that executes the functions of these elements other than the distortion device 204. The FPGA 114 may function as a signal processing unit to perform a signal processing.

The distortion compensation computing unit 230 may include multipliers 216, 218 and 220, and a complex conjugate signal output unit (Conj) 212.

The gain adjusting unit 232 may perform a gain adjustment. The MPU 122 may operate according to a program to execute the functions of the gain adjusting unit 232. The gain adjusting unit 232 inputs a gain adjusting value to the multiplier 234. More particularly, the gain adjusting unit 232 inputs the gain adjusting value having a small value. After inputting the gain adjusting value having the small value, the gain adjusting unit 232 gradually increases the gain adjusting value. The gradual increase of the gain adjusting value may be in steps. By gradually increasing the gain adjusting value, the gain adjusting unit 232 may set the gain adjusting value to a desired value.

In addition, when performing a ramp-up control, the gain adjusting unit 232 may carry out a control to widen the referring range of the distortion compensation coefficient stored in the LUT 210. The gain adjusting unit 232 may input information representing the referring range of the distortion compensation coefficient (hereinafter also referred to as "referring range information") to the multiplier 236. For example, the gain adjusting unit 232 may input to the multiplier 236, as the referring range information, a gain adjusting value that is obtained by adding a gain corresponding to one step, for example, to the gain adjusting value input to the multiplier 234. Of course, the gain adjusting unit 232 may input to the multiplier 236, as the referring range information, a gain adjusting value that is obtained by adding a gain corresponding to a plurality of steps to the gain adjusting value input to the multiplier 234.

Figure 9:
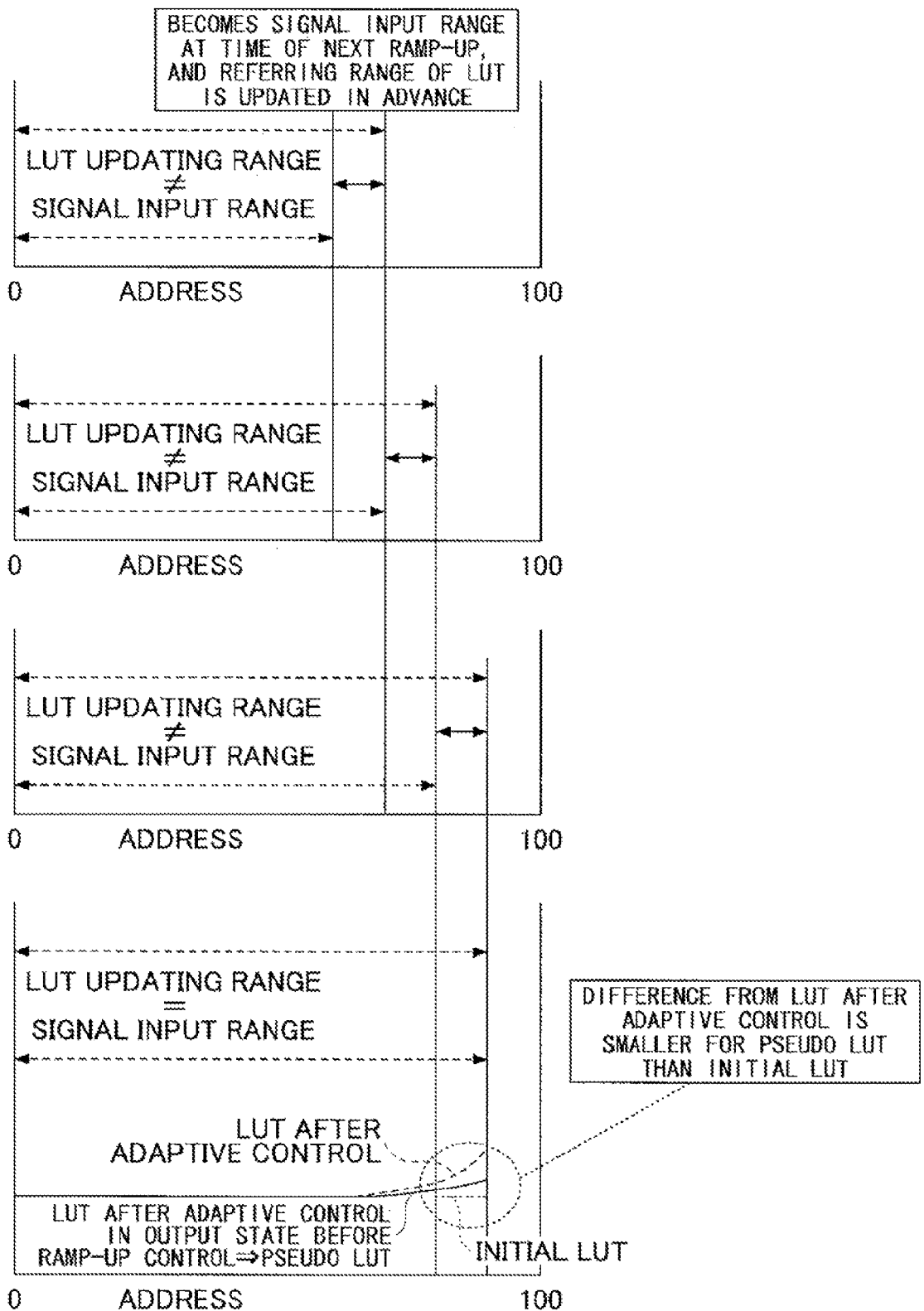
FIG. 9 is a diagram illustrating a control of a LUT referring range in one embodiment.

Next, a description will be given of a process performed by the gain adjusting unit 232, by referring to FIG. 9. FIG. 9 is a diagram illustrating a control of a LUT referring range in one embodiment.

The gain adjusting unit 232 may input the referring range information to the multiplier 236 and set the referring range of the distortion compensation coefficient in the LUT 210, in order to include the referring range of the distortion compensation coefficient that is referred to when the ramp-up control is performed the next time and the times thereafter. More particularly, the gain adjusting unit 232 may input the referring range information to the multiplier 236 and set the referring range of the distortion compensation coefficient in the LUT 210 to include the referring range of the distortion compensation coefficient that is referred to when the ramp-up control is performed the next time. The referring range of the distortion compensation coefficient in the LUT 210, including the referring range of the distortion compensation coefficient that is referred to when the ramp-up control is performed the next time, may hereinafter also be referred to as a pseudo LUT. In other words, the referring range of the distortion compensation coefficient, that is set in order to widen the referring range of the distortion compensation coefficient, may hereinafter also be referred to as the pseudo LUT.

In the example illustrated in FIG. 9, the referring range of the distortion compensation coefficient in the LUT 210, set in the pseudo LUT, may increase depending on the increase of the input power. In a case in which the referring range of the distortion compensation coefficient in the LUT 210 is near a maximum value, measures may be taken so that the referring range of the distortion compensation coefficient in the LUT 210, set in the pseudo LUT, does not increase even when the input power increases. FIG. 9 illustrates an example in which the referring range of the distortion compensation coefficient in the LUT 210, set in the pseudo LUT, is not increased even when the input power increases, when the referring range of the distortion compensation coefficient in the LUT 210, set in the pseudo LUT, becomes approximately 90% of the maximum value. Of course, 90% is merely an example, and the percentage may be changed to other appropriate values.

By generating the pseudo LUT, when a control is performed to increase the output power, the difference between the referring range of the distortion compensation coefficient in the LUT 210 before the adaptive control and the referring range of the distortion compensation coefficient in the LUT 210 after the adaptive control may be made small. Because the difference between the referring ranges of the distortion compensation coefficients in the LUTs 210 before and after the adaptive control may be made small, the probability of specifying a range of the distortion compensation coefficient that cannot be referred to may be reduced. For this reason, the probability of the power rapidly becoming high may be reduced, and the generation of the spurious noise may be reduced.

The transmitting signal x(t) may be input to the multiplier 234. The multiplier 234 may be connected to the gain adjusting unit 232. The multiplier 234 may multiply the transmitting signal x(t) to the gain adjusting value from the gain adjusting unit 232. The multiplier 234 may input a signal that is obtained by multiplying the transmitting signal x(t) to the gain adjusting value, to the multiplier 202, the multiplier 236, and the delay circuit 228.

The multiplier 236 may be connected to the multiplier 234. The multiplier 236 may multiply the signal from the multiplier 234 to the referring range information from the gain adjusting unit 232. For example, the gain adjusting unit 232 inputs to the multiplier 236, as the referring range information, the gain adjusting value that is obtained by adding a gain corresponding to one step to the gain adjusting value input to the multiplier 234. The multiplier 236 may input to the address generating circuit 208 the signal that is obtained by multiplying the signal from the multiplier 234 to the referring range information from the gain adjusting unit 232.

<Address Generating Circuit 208>

Figure 10:
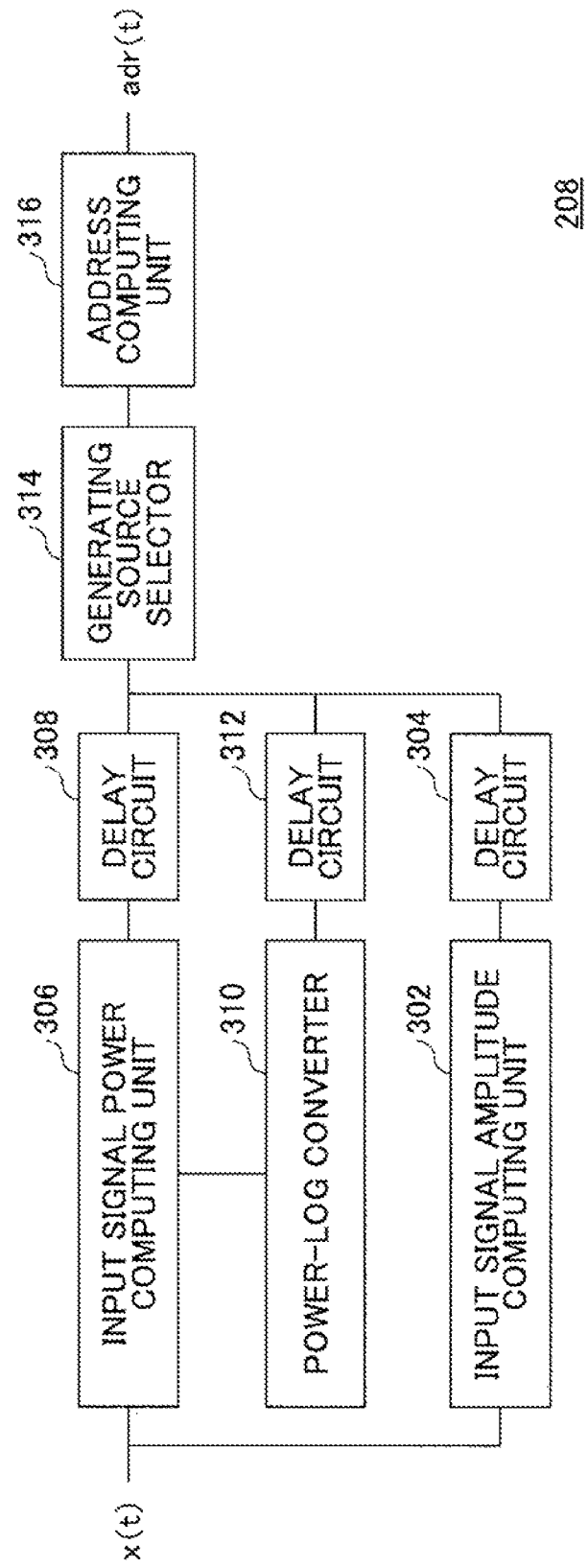
FIG. 10 is a block diagram illustrating a functional structure of an address generating circuit in one embodiment.

The address generating circuit 208 may be connected to the multiplier 236. FIG. 10 is a block diagram illustrating a functional structure of the address generating circuit in one embodiment. The address generating circuit 208 illustrated in FIG. 10 may include an input signal amplification computing unit 302, a delay circuit 304, an input signal power computing unit 306, a delay circuit 308, a power-to-logarithmic (power-log) converter 310, a delay circuit 312, a generating source selector 314, and an address computing unit 316.

The signal from the multiplier 236, that is obtained by multiplying the signal from the multiplier 234 to the referring range information from the gain adjusting unit 232, may be input to the input signal power computing unit 306. Based on the signal input thereto, the input signal power computing unit 306 may compute the transmission power. More particularly, the input signal power computing unit 306 may compute, based on the signal from the multiplier 236, a power p ($=x2(t)$) of the signal input thereto. The input signal power computing unit 306 may input the computed power of the signal (or input signal power) to the delay circuit 308 and the power-log converter 310.

The delay circuit 308 may be connected to the input signal power computing unit 306. The delay circuit 308 may input the computed power of the signal from the input signal power computing unit 306 to the generating source selector 314. The delay circuit 308 may adjust an input timing to the generating source selector 314 when inputting the computed power of the signal to the generating source selector 314.

The power-log converter 310 may be connected to the input signal power computing unit 306. The power-log converter 310 may convert the computed power of the signal from the input signal power computing unit 306 into a logarithmic value (log). The power-log converter 310 may input the logarithmic value of the computed power of the signal to the delay circuit 312.

The delay circuit 312 may be connected to the power-log converter 310. The delay circuit 312 may input the logarithmic value of the computed power of the signal from the power-log converter 310 to the generating source selector 314. The delay circuit 312 may adjust an input timing to the generating source selector 314 when inputting the logarithmic value of the computed power of the signal to the generating source selector 314.

The signal from the multiplier 236, that is obtained by multiplying the signal from the multiplier 234 to the referring range information from the gain adjusting unit 232, may be input to the input signal amplitude computing unit 302. Based on the signal input thereto, the input signal amplitude computing unit 302 may compute the amplitude of the transmitting signal. The input signal amplitude computing unit 302 may input the computed amplitude of the signal (or input signal amplitude) to the delay circuit 304.

The delay circuit 304 may be connected to the input signal amplitude computing unit 302. The delay circuit 304 may input the computed amplitude of the signal from the input signal amplitude computing unit 302 to the generating source selector 314. The delay circuit 304 may adjust an input timing to the generating source selector 314 when inputting the computed amplitude of the signal to the generating source selector 314.

The generating source selector 314 may be connected to the delay circuits 304, 308, and 312. The generating source selector 314 may select the signal that is to be the generating source of the address. More particularly, the generating source selector 314 may select the signal that is to be the generating source of the address, based on the computed amplitude of the signal from the delay circuit 304, the computed power of the signal from the delay circuit 308, and the converted logarithmic value of the power of the signal from the delay circuit 312. The generating source selector 314 inputs the selected signal that is to be the generating source of the address to the address computing unit 316.

The address computing unit 316 may be connected to the generating source selector 314. The address computing unit 316 may convert the information indicating the signal that is to be the generating source of the address and is input from the generating source selector 314 into the address. More particularly, the address computing unit 316 may generate an address in a first dimensional direction corresponding to the power p ($=x2(t)$) of the signal at a time t. For example, the address computing unit 316 may generate an address in the X-axis direction. In addition, when the address computing unit 316 generates the address in the first dimensional direction, the address computing unit 316 obtains a difference $\Delta P$ between the power p ($=x2(t)$) of the signal at the time t and a power p1 ($=x2(t-1)$) of the signal at a time (t−1) that is before the time t. The address computing unit 316 may generate an address in a second dimensional direction, different from the first dimensional direction corresponding to the power p ($=x2(t)$) of the signal at the time t, and corresponding to the difference $\Delta P$. For example, the address computing unit 316 may generate an address in the Y-axis direction. The address computing unit 316 may regard an address that includes the address in the first dimensional direction and the address in the second dimensional direction as address specifying information (AR) (adr(t)) at the time t, and output the address specifying information. The storage location in the LUT 210 is specified by the address specifying information output from the address computing unit 316.

The distortion compensation coefficient $h_{n-1}(p)$ stored at the address specified by the address specifying information from the address computing unit 316 may be read from the LUT 210. The distortion compensation coefficient $h_{n-1}(p)$ read from the LUT 210 may be input to the multiplier 202. The multiplier 202 may utilize the distortion compensation coefficient $h_{n-1}(p)$ read from the LUT 210 when the distortion compensation process is performed. More particularly, the multiplier 202 may multiply the distortion compensation coefficient $h_{n-1}(p)$ to the signal from the multiplier 234. The multiplier 202 may input to the distortion device 204 the signal that is obtained by multiplying the distortion compensation coefficient $h_{n-1}(p)$ to the signal from the multiplier 234.

The delay circuit 224 may be connected to the address generating circuit 208. The delay circuit 224 may input the address specifying information from the address generating circuit 208 to the LUT 210, as a read address (AR). The read address (AR) and a write address (AW) may be the same address. In this case, the updated value of the distortion compensation coefficient may be written to the write address after the computation process. Accordingly, the delay circuit 224 may delay the read address (AR) to be input to the LUT 210 depending on the time required to perform the computation process. By delaying input of the read address (AR) to the LUT 210, the read address (AR) may be used as the write address (AW).

The LUT 210 may be connected to the address generating circuit 208 and the delay circuit 224. The LUT 210 stores the distortion compensation coefficient for cancelling the distortion of the distortion device 204, at a two-dimensional address location corresponding to each discrete power of the transmitting signal x(t). The distortion compensation coefficient $h_{n-1}(p)$ specified by the address specifying information from the address generating circuit 208 and the delay circuit 224 is read from the LUT 210 and input to the multiplier 202 and the delay circuit 226.

The multiplier 202 may be connected to the multiplier 234. The multiplier 202 may multiply the signal from the multiplier 234 to the distortion compensation coefficient $h_{n-1}(P)$ read from the LUT 210. The multiplier 202 may execute the functions of the pre-distortion unit 136 of the transmission apparatus 200 illustrated in FIG. 7. The multiplier 202 may input to the distortion device 204 the signal that is obtained by multiplying the signal from the multiplier 234 to the distortion compensation coefficient $h_{n-1}(P)$ read from the LUT 210.

The distortion device 204 may be connected to the multiplier 202. The multiplier 202 may adjust the power level of the signal that is obtained by multiplying the signal from the multiplier 234 to the distortion compensation coefficient $h_{n-1}(p)$ read from the LUT 210, in order to perform a power amplification. The distortion device 204 may execute the functions of the PA 108. The distortion device 204 output a power-amplified signal y(t), and this power-amplified signal y(t) may be input to the feedback processing unit 206.

The feedback processing unit 206 may be connected to the distortion device 204. The feedback processing unit 206 may execute the functions of the down-converter 118, the quadrature detector 126 and the A/D converter 120 of the transmission apparatus 200 illustrated in FIG. 7, with respect to the signal from the distortion device 204. The feedback processing unit 206 may input to the distortion compensation computing unit 230 and the subtractor 214 the signal that is obtained by executing the functions of the down-converter 118, the quadrature detector 126 and the A/D converter 120 of the transmission apparatus 200 illustrated in FIG. 7, with respect to the signal from the distortion device 204.

The delay circuit 228 may be connected to the multiplier 234. The delay circuit 228 may delay the signal from the multiplier 234, and input the delayed signal to the subtractor 214.

The subtractor 214 may be connected to the delay circuit 228 and the feedback processing unit 206. The subtractor 214 may obtain a difference signal e(t) between the signal from the delay circuit 228, obtained by multiplying the gain adjusting value to the transmitting signal x(t), and the demodulated signal y(t) from the feedback processing unit 206. The subtractor 214 may input the difference signal e(t) to the distortion compensation computing unit 230.

The distortion compensation computing unit 230 may be connected to the feedback processing unit 206 and the subtractor 214. The distortion compensation computing unit 230 may function as an example of the updating unit to compute the updated value of the coefficient compensation coefficient to be stored in the LUT 210, based on the demodulated signal y(t) from the feedback processing unit 206 and the difference signal e(t) from the subtractor 214. The distortion compensation computing unit 230 may input information indicating the updated value to the adder 222.

The adder 222 may be connected to the distortion compensation computing unit 230, the LUT 210, and the delay circuit 226. The adder 222 may add the information indicating the updated value from the distortion compensation computing unit 230, and the distortion compensation coefficient $h_{n-1}(p)$. The updated value of the referring range of the LUT 210 may be obtained by adding the information indicating the updated value from the distortion compensation computing unit 230, and the distortion compensation coefficient $h_{n-1}(P)$.

In addition, the updated value of the referring range of the LUT 210 may be stored as the address corresponding to the power $p (=x2(t))$ of the transmitting signal. More particularly, the updated value of the referring range of the LUT 210 may be stored in the address generating circuit 208 as the write address (AW) specified by the address in the X-axis direction and the address in the Y-axis direction.

<Distortion Compensation Computing Unit 230>

The distortion compensation computing unit 230 may include the multipliers 216, 218 and 220, and the complex conjugate signal output unit 212.

The complex conjugate signal output unit 212 may be connected to the feedback processing unit 206. The complex conjugate signal output unit 212 may generate a complex conjugate signal y*(t) of the demodulated signal y(t) from the feedback processing unit 206. The complex conjugate signal output unit 212 may output the complex conjugate signal y*(t) to the multiplier 218.

The multiplier 218 may be connected to the complex conjugate signal output unit 212 and the delay circuit 226. The multiplier 218 may multiply the complex conjugate signal y*(t) from the complex conjugate signal output unit 212 to the distortion compensation coefficient $h_{n-1}(p)$ from the delay circuit 226. The multiplier 218 may input a signal u*(t) $(=h_{n-1}(p)\ y^*(t))$, obtained by multiplying the complex conjugate signal y*(t) to the distortion compensation coefficient $h_{n-1}(p)$, to the multiplier 216.

The multiplier 216 may be connected to the subtractor 214 and the multiplier 218. The multiplier 216 may multiply the difference signal e(t) from the subtractor 214 and the signal u*(t) from the multiplier 218. The multiplier 216 may input a signal e(t)u*(t), obtained by multiplying the difference signal e(t) to the signal u*(t), to the multiplier 220.

The multiplier 220 may be connected to the multiplier 216. The multiplier 220 may multiply the signal e(t)u*(t) from the multiplier 216 to a step size parameter p. The multiplier 220 may input a signal μe(t)u*(t), obtained by multiplying the signal e(t)u*(t) to the step size parameter p, to the adder 222.

The adder 222 may be connected to the multiplier 220 and the delay circuit 226. The adder 222 may add the signal μe(t)u*(t) from the multiplier 220 and the distortion compensation coefficient $h_{n-1}(p)$ from the delay circuit 226.

The delay circuits 224, 226, and 228 may add a delay time to the transmitting signal, respectively. More particularly, the delay time, from a time when the signal in which the gain adjusting value is multiplied to the transmitting signal x(t) is input to the multiplier 202 and the delay circuit 228, to a time when the demodulated signal y(t) from the feedback processing unit 206 is input to the subtractor 214, is added by the delay circuits 224, 226, and 228.

The delay time, from the time when the signal in which the gain adjusting value is multiplied to the transmitting signal x(t) is input to the multiplier 202 and the delay circuit 228, to the time when the demodulated signal y(t) from the feedback processing unit 206 is input to the subtractor 214, may be referred to as a delay time D. More particularly, the delay times set in the delay circuits 224, 226, and 228 are determined so as to satisfy D=D0+D1, where D0 denotes the delay time generated in the distortion device 204 and D1 denotes the delay time generated in the feedback processing unit 206.

In addition, the distortion compensation coefficient h(p) may be updated so that the difference signal e(t) between the signal in which the gain adjusting value is multiplied to the transmitting signal x(t) and the fed back demodulated signal y(t) becomes a minimum. The distortion compensation coefficient may finally converge to an optimum value, in order to compensate for the distortion generated in the PA 108.

<Operation of Transmission Apparatus 200>

Figure 11:
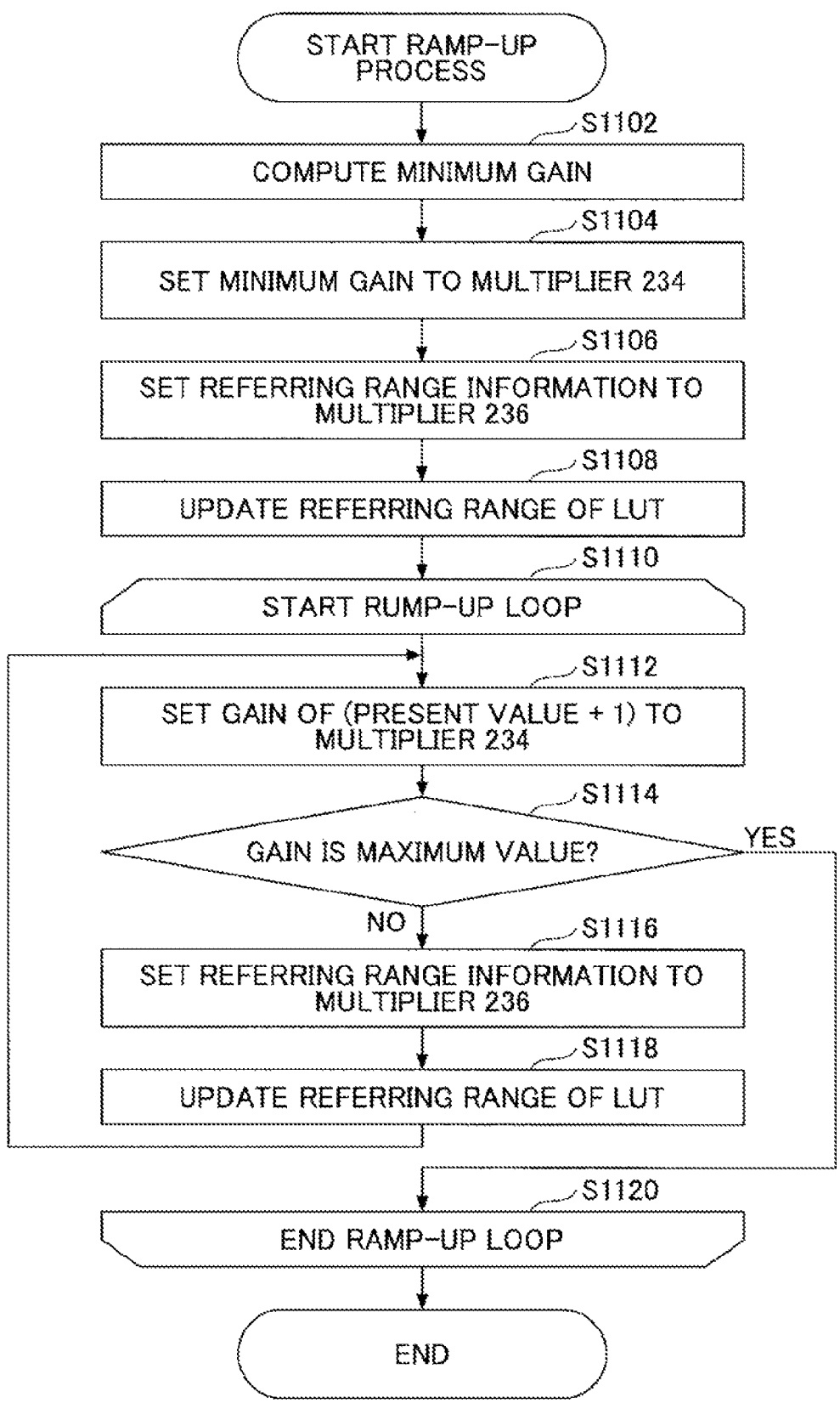
FIG. 11 is a flow chart for explaining an operation of the transmission apparatus in one embodiment.

FIG. 11 is a flow chart for explaining an operation of the transmission apparatus in one embodiment. In the transmission apparatus 200 at the time of the ramp-up control, a correspondence is determined between a gain width with which the gain adjusting value to be multiplied to the transmitting signal is increased or decreased, and the referring range of the distortion compensation coefficient in the LUT 210. In the example illustrated in FIG. 11, a range with which the referring range of the distortion compensation coefficient in the LUT 210 is increased or decreased, corresponding to one (1) step representing the gain width with which the gain adjusting value to be multiplied to the transmitting signal is increased or decreased, may be referred to as one (1) size.

In a step 1102 illustrated in FIG. 11, the gain adjusting unit 232 computes a minimum gain. In a step S1104, the gain adjusting unit 232 sets the minimum gain computed in the step S1102 to the multiplier 234. In a step S1106, the gain adjusting unit 232 sets the referring range information to the multiplier 236. The gain adjusting unit 232 may set, as the referring range information, a gain that is obtained by adding a gain corresponding to one step to the minimum gain computed in the step S1102. By setting the gain that is obtained by adding the gain corresponding to one step to the minimum gain, the size corresponding to one step, that is, the referring range of the distortion compensation coefficient, may be widened.

In the step S1108, information indicating the updated value of the distortion compensation coefficient may be input from the adder 222 to the LUT 210, depending on the delay times set in the delay circuits 224, 226, and 228. By inputting the information indicating the updated value of the distortion compensation coefficient to the LUT 210, the referring range of the distortion compensation coefficient in the LUT 210 may be updated.

In a step S1110, the PA 108 may start the ramp-up control. In a step S1112, the gain adjusting unit 232 may set a gain adjusting value, obtained by adding the gain corresponding to one step to the set gain, to the multiplier 234. In a step S1114, the gain adjusting unit 232 may judge whether the gain adjusting value set in the step S1112 is a maximum value.

In a step S1116 that is performed when a judgement result in the step S1114 is NO, the gain adjusting unit 232 may set the referring range information to the multiplier 236. The gain adjusting unit 232 may set, as the referring range information, a gain adjusting value that is obtained by adding a gain corresponding to one step to the present value. By setting the gain adjusting value that is obtained by adding the gain corresponding to one step to the present value, the size corresponding to one step, that is, the referring range of the distortion compensation coefficient, may be widened.

In a step S1118, the updated value of the distortion compensation value may be input from the adder 222 to the LUT 210, depending on the delay times set in the delay circuits 224, 226, and 228. The referring range of the LUT 210 may be updated by inputting the updated value of the distortion compensation coefficient. The process may return to the step S1112 when the LUT 210 is updated.

On the other hand, a step S1120 is performed when the judgement result in the step S1114 is YES. In the step S1120, the PA 108 ends the ramp-up control (or ramp-up loop).

<Modification>

Figure 12:
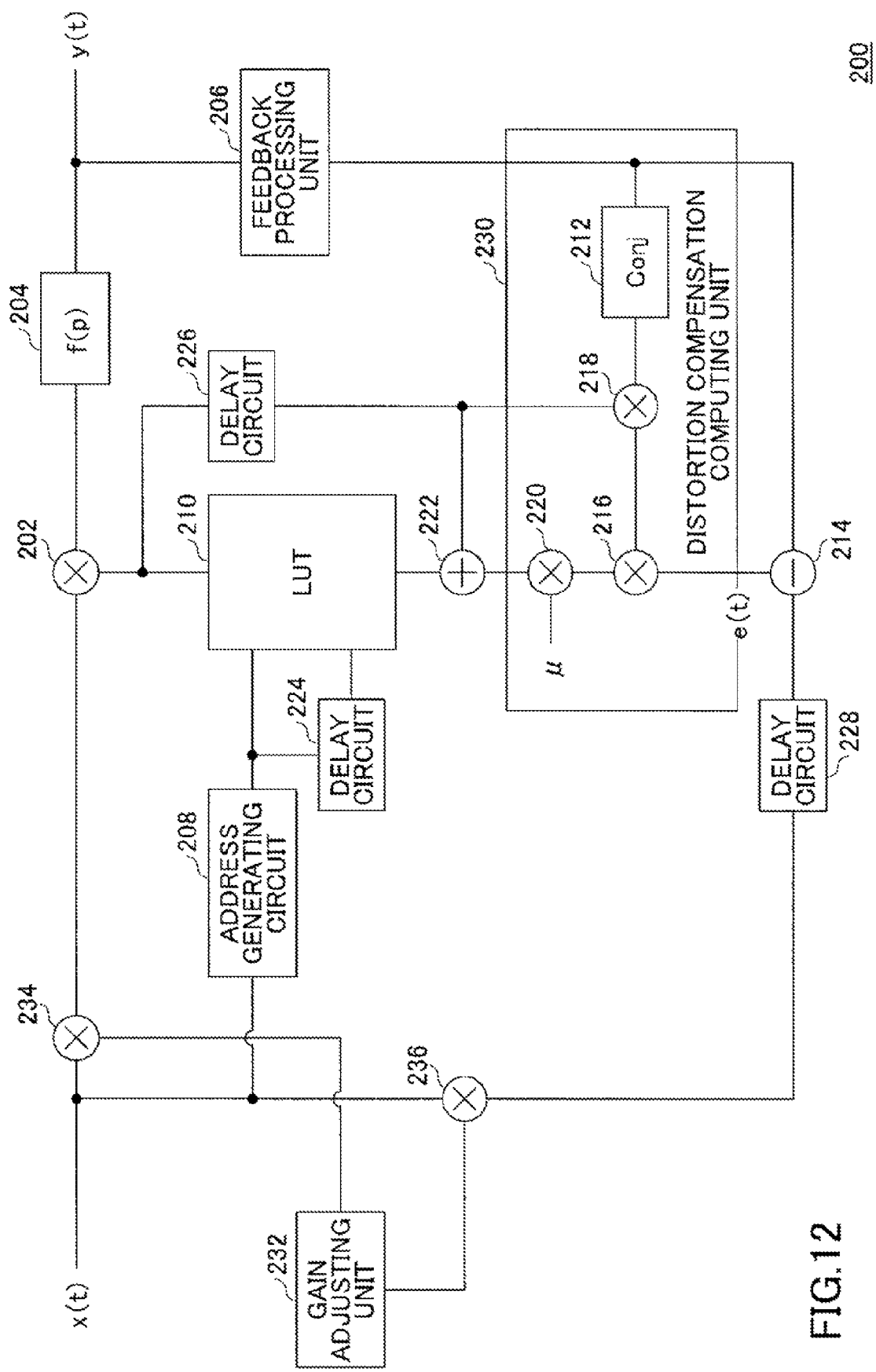
FIG. 12 is a diagram illustrating the transmission apparatus in a modification, including the details of the distortion compensating unit.

FIG. 12 is a diagram illustrating the transmission apparatus in a modification, including the details of the distortion compensating unit.

This modification of the transmission apparatus 200 differs from the transmission apparatus 200 illustrated in FIG. 8, in that the transmitting signal x(t) may be input to the address generating circuit 208, and the multipliers 234 and 236, and the output signal of the multiplier 236 may be input to the delay circuit 228 in this modification.

The gain adjusting unit 232 may perform the gain adjustment. The MPU 122 may function as the gain adjusting unit 232 by operating according to the program. The gain adjusting unit 232 may input the gain adjusting value to the multipliers 234 and 236. More particularly, the gain adjusting unit 232 may input the gain adjusting value having a small value. After inputting the gain adjusting value having the small value, the gain adjusting unit 232 may gradually increase the gain adjusting value. The increments with which the gain adjusting value is gradually increased may be referred to as a step. By gradually increasing the gain adjusting value, the gain adjusting unit 232 may set the gain adjusting value to a desired value.

The transmitting signal x(t) may be input to the multipliers 234 and 236. The multiplier 234 may be connected to the gain adjusting unit 232. The multiplier 234 may multiply the gain adjusting value from the gain adjusting unit 232 to the transmitting signal x(t). The multiplier 234 may input a signal obtained by multiplying the gain adjusting value to the transmitting signal x(t), to the multiplier 202.

The multiplier 236 may be connected to the gain adjusting unit 232. The multiplier 236 may multiply the gain adjusting value from the gain adjusting unit 232 to the transmitting signal x(t). The multiplier 236 may input a signal obtained by multiplying the gain adjusting value to the transmitting signal x(t), to the delay circuit 228.

In the transmission apparatus 200 illustrated in FIG. 12, a control may be carried out so that the power of the signal forwarded and the power of the signal fed back (that is, the feedback signal) become the same. In other words, the same gain adjusting value is set in the multipliers 234 and 236 of the transmission apparatus 200. By setting the same gain adjusting value to the multipliers 234 and 236, the processing in the gain adjusting unit 232 may be reduced. In other words, the control may be carried out so that the power of the signal output from the multiplier 236 and the power of the signal output from the feedback processing unit 206 become the same.

On the other hand, the power of the transmitting signal x(t) input to the address generating circuit 208 may become a maximum. In other words, the address generating circuit 208 may set the referring range of the distortion compensation coefficient in the LUT 210 to include the entire referring range of the distortion compensation coefficient referred to when the ramp-up control is performed.

Figure 13:
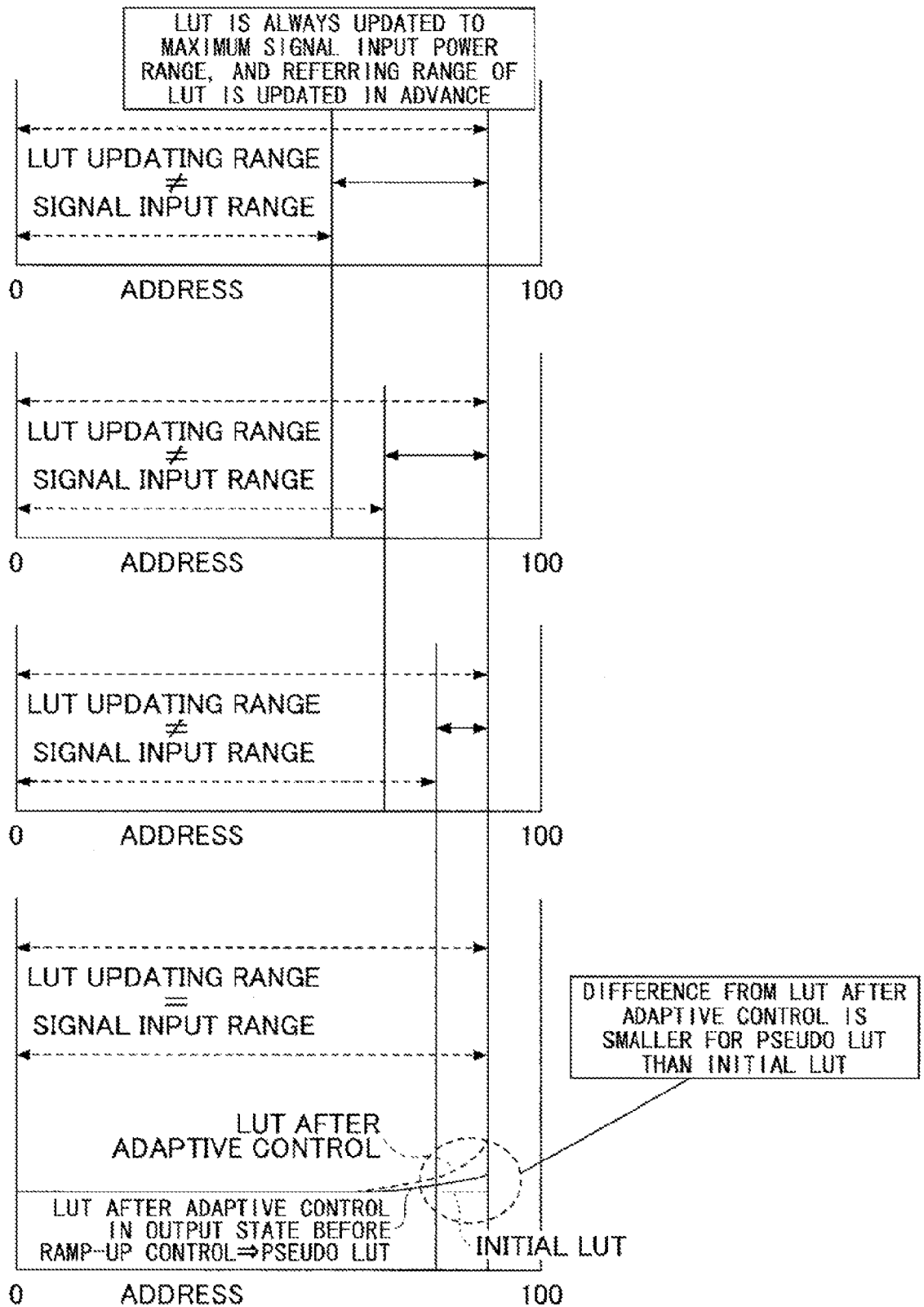
FIG. 13 is a diagram illustrating the control of the LUT referring range in one modification.

FIG. 13 is a diagram illustrating the control of the LUT referring range in one modification. FIG. 13 illustrates the process performed by the address generating circuit 208 in this modification.

The address generating circuit 208 may set the referring range of the distortion compensation coefficient in the LUT 210 to include the referring range of the distortion compensation coefficient referred to the next time the ramp-up control is performed. More particularly, the address generating circuit 208 may set the referring range of the distortion compensation coefficient in the LUT 210 to include the entire referring range of the distortion compensation coefficient referred to when the ramp-up control is performed. The referring range of the distortion compensation coefficient in the LUT 210, including the entire referring range of the distortion compensation coefficient that is referred to when the ramp-up control is performed, may hereinafter also be referred to as a pseudo LUT. In other words, the referring range of the distortion compensation coefficient, that is set in order to widen the referring range of the distortion compensation coefficient, may hereinafter also be referred to as the pseudo LUT.

In the example illustrated in FIG. 13, the referring range of the distortion compensation coefficient in the LUT 210 may be set in a vanity of the entire referring range. In other words, the referring range of the distortion compensation coefficient in the LUT 210 may be set to a value less than the maximum value. FIG. 13 illustrates an example in which the referring range of the distortion compensation coefficient in the LUT 210, set in the pseudo LUT, is approximately 90% of the maximum value. Of course, 90% is merely an example, and the percentage may be changed to other appropriate values.

By generating the pseudo LUT, when a control is performed to increase the output power, the difference between the referring range of the distortion compensation coefficient in the LUT 210 before the adaptive control and the referring range of the distortion compensation coefficient in the LUT 210 after the adaptive control may be made small. Because the difference between the referring ranges of the distortion compensation coefficients in the LUTs 210 before and after the adaptive control may be made small, the probability of specifying a range of the distortion compensation coefficient that cannot be referred to may be reduced. For this reason, the probability of the power rapidly becoming high may be reduced, and the generation of the spurious noise may be reduced.

<Operation of Transmission Apparatus 200>

Figure 14:
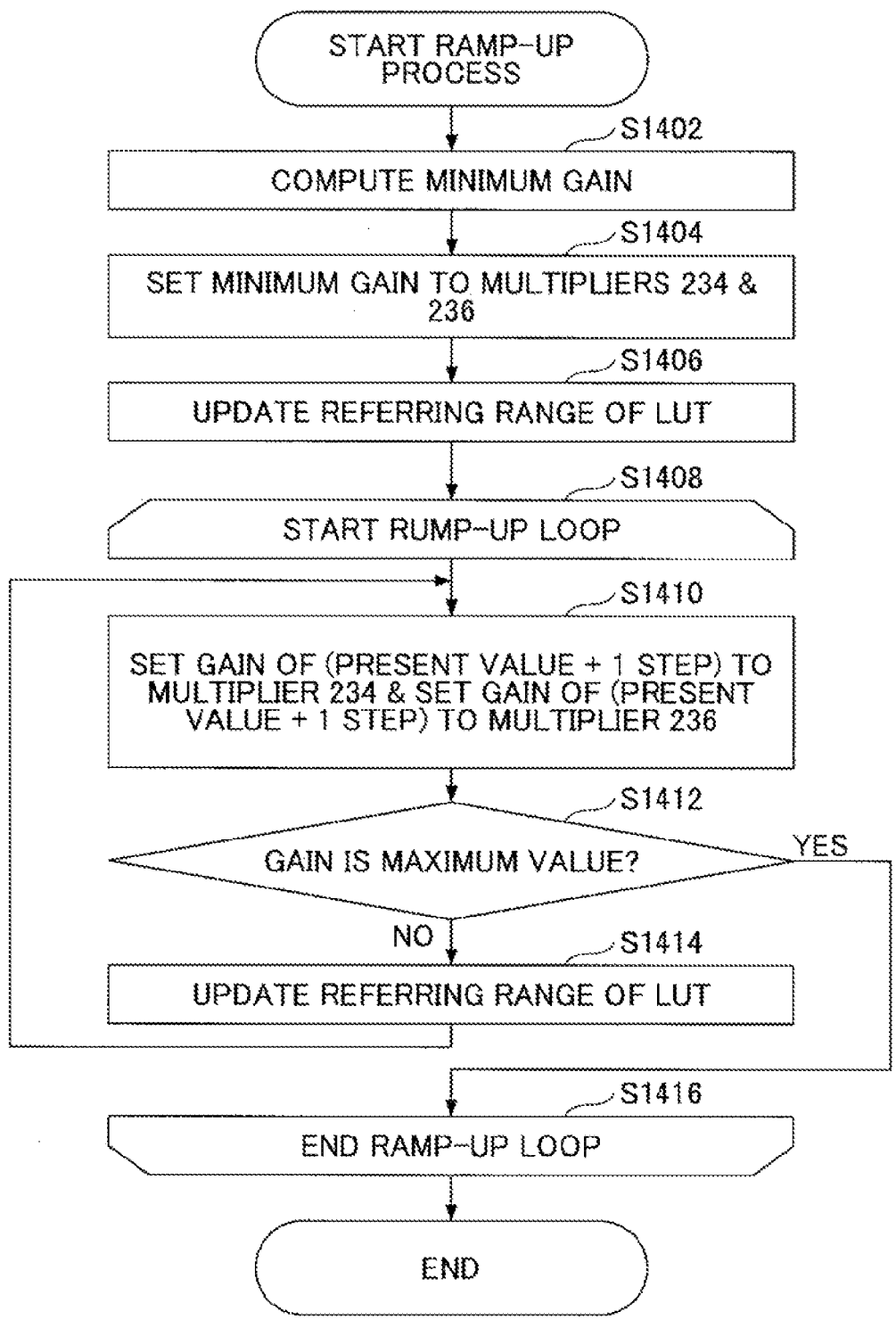
FIG. 14 is a flow chart for explaining the operation of the transmission apparatus in one modification.

FIG. 14 is a flow chart for explaining the operation of the transmission apparatus in one modification. The gain width that increases or decreases the gain adjusting value multiplied to the transmitting signal is set in the transmission apparatus 200 when performing the ramp-up control. In addition, the referring range of the distortion compensation coefficient in the LUT 210 is set in the vicinity of the entire referring range, in the transmission apparatus 200. In the example illustrated in FIG. 14, the gain width with which the gain adjusting value to be multiplied to the transmitting signal is increased or decreased when performing the ramp-up control may be set to one step.

In a step S1402 illustrated in FIG. 14, the gain adjusting unit 232 may compute a minimum gain. In a step S1404, the gain adjusting unit 232 may set the minimum gain computed in the step S1402 to the multipliers 234 and 236. In a step S1406, information indicting the updated value of the distortion compensation coefficient is input from the adder 222 to the LUT 210, depending on the delay times set in the delay circuits 224, 226, and 228. By inputting the information indicating the updated value of the distortion compensation coefficient to the LUT 210, the referring range of the distortion compensation coefficient in the LUT 210 may be updated.

In a step S1408, the PA 108 starts a ramp-up control. In a step S1410, the gain adjusting circuit 232 sets a gain adjusting value that is obtained by adding a gain corresponding to one step to the set gain, to the multipliers 234 and 236. In a step S1412, the gain adjusting unit 232 judges whether the gain adjusting value set in the step S1410 is a maximum value.

In a step S1414 that is performed when the judgement result in the step S1412 is NO, the information indicating the updated value of the distortion compensation coefficient is input from the adder 222 to the LUT 210, depending on the delay times set in the delay circuits 224, 226, and 228. By inputting the information indicating the updated value of the distortion compensation coefficient, the referring range of the distortion compensation coefficient in the LUT 210 may be updated. In this example, the referring range of the distortion compensation coefficient in the LUT 210 may be set in the vicinity of the entire referring range. The process may return to the step S1410 when the LUT 210 is updated.

On the other hand, a step S1416 is performed when the judgement result in the step S1412 is YES. In the step S1416, the PA 108 ends the ramp-up control (or ramp-up loop).

According to the embodiment and the modification described above, the referring range of the distortion compensation coefficient in the LUT may be widened in a direction towards the larger address, in the transmission apparatus employing the digital non-linear distortion compensation technique.

Figure 15:
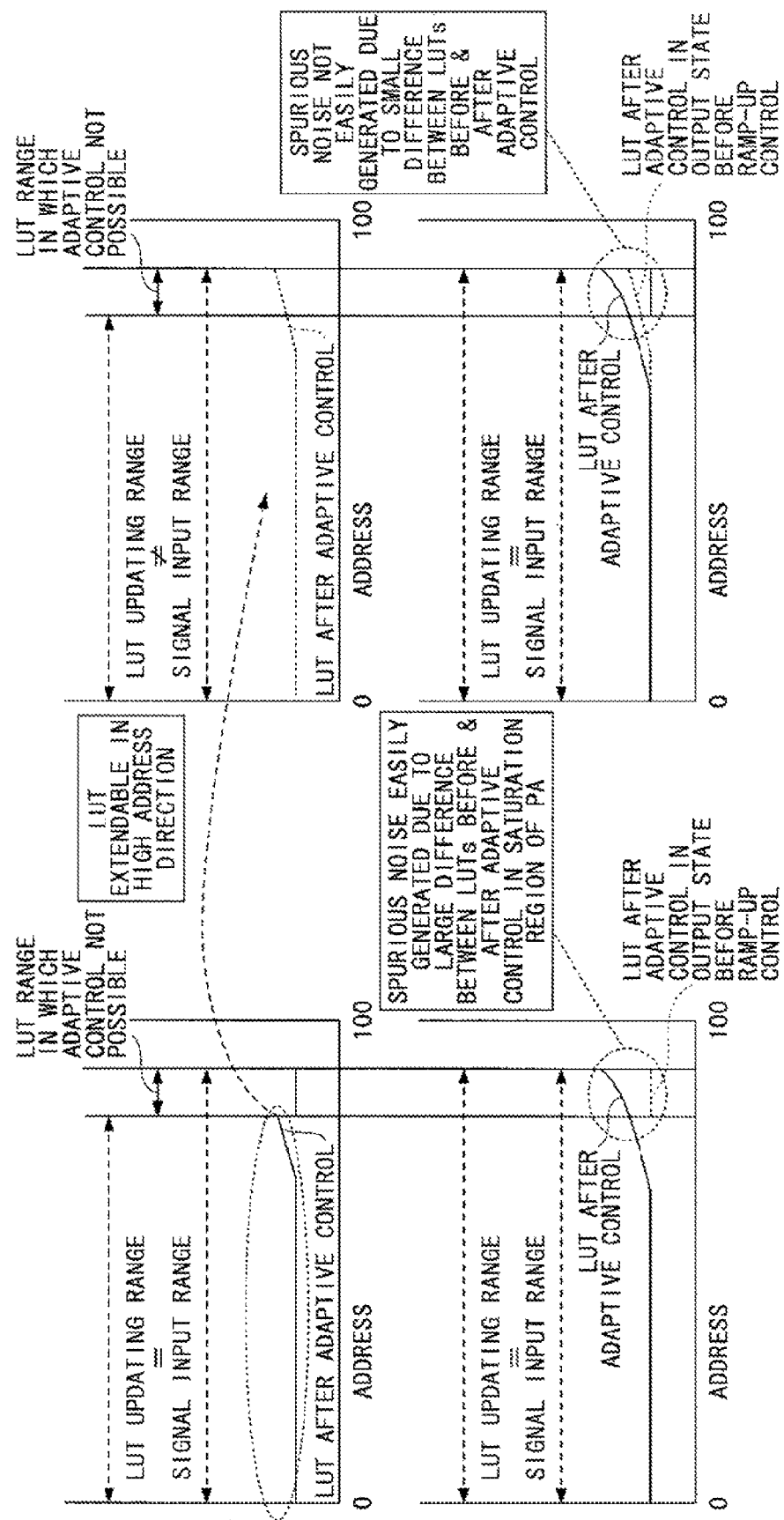
FIG. 15 is a diagram illustrating the LUT referring range.

FIG. 15 is a diagram illustrating the LUT referring range. The left part of FIG. 15 illustrates the referring range of the distortion compensation coefficient in the LUT of the conventional transmission apparatus, and the right part of FIG. 15 illustrates the referring range of the distortion compensation coefficient in the LUT of the transmission apparatus in accordance with the embodiment. Further, in both the left part and the right part of FIG. 15, the upper half of FIG. 15 illustrates a case in which the input power is low, and the lower half illustrates a case in which the input power is high.

When the input power is low, the conventional transmission apparatus may control the referring range of the distortion compensation coefficient in the LUT in correspondence with the input power. For this reason, when the distortion compensation coefficient outside the referring range is selected, the distortion compensation cannot be carried out adaptively, and the spurious noise may be generated.

On the other hand, in the case of the transmission apparatus in the embodiment, the referring range of the distortion compensation coefficient in the LUT may be widened (or expanded) in correspondence with the input power. For this reason, the probability that the distortion compensation coefficient outside the referring range is selected may be reduced. Because the probability that the distortion compensation coefficient outside the referring range is selected may be reduced, the probability that the power rapidly becomes high may be reduced, and the generation of the spurious noise may be reduced.

When the input power is high, the conventional transmission apparatus may control the referring range of the distortion compensation coefficient in the LUT in correspondence with the input power. In other words, the referring range of the distortion compensation coefficient in the LUT may be controlled based on the output power of one rump-up before. For this reason, the difference between the referring ranges of the distortion compensation coefficients in the LUT before and after the distortion compensation may become large. Particularly, the difference between the referring ranges of the distortion compensation coefficients in the LUT before and after the distortion compensation may become notable in the saturation region of the power amplifier. When the distortion compensation coefficient outside the referring range is selected, the distortion compensation cannot be carried out adaptively, and the spurious noise may be generated.

On the other hand, in the case of the transmission apparatus in the embodiment, the referring range of the distortion compensation coefficient in the LUT may be widened (or expanded) in correspondence with the input power. For this reason, the difference between the referring ranges of the distortion compensation coefficients in the LUT before and after the distortion compensation may be made small. In addition, the probability that the distortion compensation coefficient outside the referring range is selected may be reduced. Because the probability that the distortion compensation coefficient outside the referring range is selected may be reduced, the generation of the spurious noise may be reduced.

In the embodiment and the modification described above, a program executed by a computer, such as the MPU, may be stored in any suitable non-transitory computer-readable storage medium which may include the internal memory or recording medium within the distortion compensating unit 130, for example, and the external memory or recording medium externally connected to the distortion compensating unit 130, for example. An example of such a memory or recording medium may be connected to the MPU 122. In other words, the non-transitory computer readable storage medium may have stored therein a program for causing a computer to execute at least a part of the process of the transmission apparatus 200.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission apparatus comprising:
    a storage unit configured to store a transmission power, and a distortion compensation coefficient to compensate for a distortion that is generated when making a transmission at the transmission power, in correspondence with each other;
    a signal processing unit configured to perform a distortion compensation process on a transmitting signal, based on the distortion compensation coefficient stored in the storage unit;
    an updating unit configured to update the transmission power of the transmitting signal that is subjected to the distortion compensation process in certain processes steps; and
    a transmitting unit configured to transmit the transmitting signal at the transmission power updated by the updating unit,
    wherein the signal processing unit sets a referring range of the distortion compensation coefficient stored in the storage unit, based on the transmitting signal before performing the distortion compensation process and the transmitting signal having the transmission power thereof updated by the updating unit, and updates the referring range depending on a transmission power that is set by the updating unit a next time and times thereafter when the distortion compensation process is performed.

2. The transmission apparatus as claimed in claim 1, wherein the updating unit increases the transmission power of the transmitting signal that is subjected to the distortion compensation process by the signal processing unit.

3. The transmission apparatus as claimed in claim 1, wherein the signal processing unit updates the referring range depending on the transmission power that is set the next time when the distortion compensation process is performed.

4. The transmission apparatus as claimed in claim 1, wherein the signal processing unit updates the referring range to a maximum range.

5. The transmission apparatus as claimed in claim 1, wherein the signal processing unit performs the distortion compensation process on a signal that is obtained by multiplying a first gain to the transmitting signal before performing the distortion compensation process, and specifies a distortion compensation coefficient that is stored in the storage unit and is to be used for the distortion compensation process, based on the transmitting signal that is multiplied by a second gain different from the first gain.

6. The transmission apparatus as claimed in claim 1, wherein the signal processing unit performs the distortion compensation process on a signal that is obtained by multiplying a gain to the transmitting signal before performing the distortion compensation process, and specifies a distortion compensation coefficient that is stored in the storage unit and is to be used for the distortion compensation process, based on the transmitting signal.

7. The transmission apparatus as claimed in claim 1, wherein the signal processing unit performs a control so that a difference between the transmitting signal before performing the distortion compensation process and the transmitting signal having the transmission power thereof updated by the updating unit becomes zero.

8. The transmission apparatus as claimed in claim 1, wherein the updating unit performs a ramp-up control.

9. A base station comprising:
    the transmission apparatus as claimed in claim 1; and
    an antenna configured to transmit the transmitting signal from the transmitting unit.

10. A transmission method comprising:
    performing a distortion compensation process on a transmitting signal, based on a distortion compensation coefficient stored in a storage unit that stores a transmission power and the distortion compensation coefficient to compensate for a distortion that is generated when making a transmission at the transmission power, in correspondence with each other;
    updating the transmission power of the transmitting signal that is subjected to the distortion compensation process in certain processes;
    transmitting the transmitting signal at the transmission power that is updated by the updating; and
    setting a referring range of the distortion compensation coefficient stored in the storage unit, based on the transmitting signal before performing the distortion compensation process and the transmitting signal having the transmission power thereof updated by the updating, to update the referring range depending on a transmission power that is set by the updating a next time and times thereafter when the distortion compensation process is performed.

11. The transmission method as claimed in claim 10, wherein the updating increases the transmission power of the transmitting signal that is subjected to the distortion compensation process by the performing the distortion compensation process.

12. The transmission method as claimed in claim 10, wherein the setting updates the referring range depending on the transmission power that is set the next time when the distortion compensation process is performed by the performing the distortion compensation process.

13. The transmission method as claimed in claim 10, wherein the updating updates the referring range to a maximum range.

* * * * *